(12) United States Patent
Yu et al.

(10) Patent No.: US 11,888,031 B2
(45) Date of Patent: Jan. 30, 2024

(54) FIN-BASED LATERAL BIPOLAR JUNCTION TRANSISTOR AND METHOD

(71) Applicant: GlobalFoundries U.S. Inc., Malta, NY (US)

(72) Inventors: Hong Yu, Clifton Park, NY (US); Judson R. Holt, Ballston Lake, NY (US); Zhenyu Hu, Clifton Park, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 88 days.

(21) Appl. No.: 17/537,564

(22) Filed: Nov. 30, 2021

(65) Prior Publication Data
US 2023/0066963 A1  Mar. 2, 2023

Related U.S. Application Data

(60) Provisional application No. 63/237,549, filed on Aug. 27, 2021.

(51) Int. Cl.
*H01L 29/10* (2006.01)
*H01L 29/165* (2006.01)
*H01L 29/66* (2006.01)
*H01L 29/737* (2006.01)
*H01L 29/735* (2006.01)

(52) U.S. Cl.
CPC ........ *H01L 29/1008* (2013.01); *H01L 29/165* (2013.01); *H01L 29/66242* (2013.01); *H01L 29/735* (2013.01); *H01L 29/737* (2013.01)

(58) Field of Classification Search
None
See application file for complete search history.

(56) References Cited

U.S. PATENT DOCUMENTS

| | | | |
|---|---|---|---|
| 5,102,812 A * | 4/1992 | Caneau | H01L 21/30612 438/494 |
| 6,949,764 B2 | 9/2005 | Ning | |
| 8,288,758 B2 | 10/2012 | Ning et al. | |
| 8,420,493 B2 | 4/2013 | Ning et al. | |
| 8,586,441 B1 | 11/2013 | Cai et al. | |
| 10,741,645 B2 | 8/2020 | Balakrishnan et al. | |

(Continued)

*Primary Examiner* — Evren Seven
*Assistant Examiner* — Cole Leon Lindsey
(74) *Attorney, Agent, or Firm* — Francois Pagette; Hoffman Warnick LLC

(57) ABSTRACT

In a disclosed semiconductor structure, a lateral bipolar junction transistor (BJT) has a base positioned laterally between a collector and an emitter. The base includes a semiconductor fin with a first portion that extends from a substrate through an isolation layer, a second portion on the first portion, and a third portion on the second portion. The collector and emitter are on the isolation layer and positioned laterally immediately adjacent to opposing sidewalls of the second portion of the semiconductor fin. In some embodiments, the BJT is a standard BJT where the semiconductor fin (i.e., the base), the collector, and the emitter are made of the same semiconductor material. In other embodiments, the BJT is a heterojunction bipolar transistor (HBT) where a section of the semiconductor fin (i.e., the base) is made of a different semiconductor material for improved performance. Also disclosed is a method of forming the structure.

16 Claims, 25 Drawing Sheets

(56) References Cited

U.S. PATENT DOCUMENTS

| | | | |
|---|---|---|---|
| 10,825,921 B2 | 11/2020 | Balakrishnan et al. | |
| 2019/0123141 A1* | 4/2019 | Balakrishnan | H01L 29/6625 |
| 2021/0296309 A1* | 9/2021 | Chang | H01L 21/8249 |

* cited by examiner

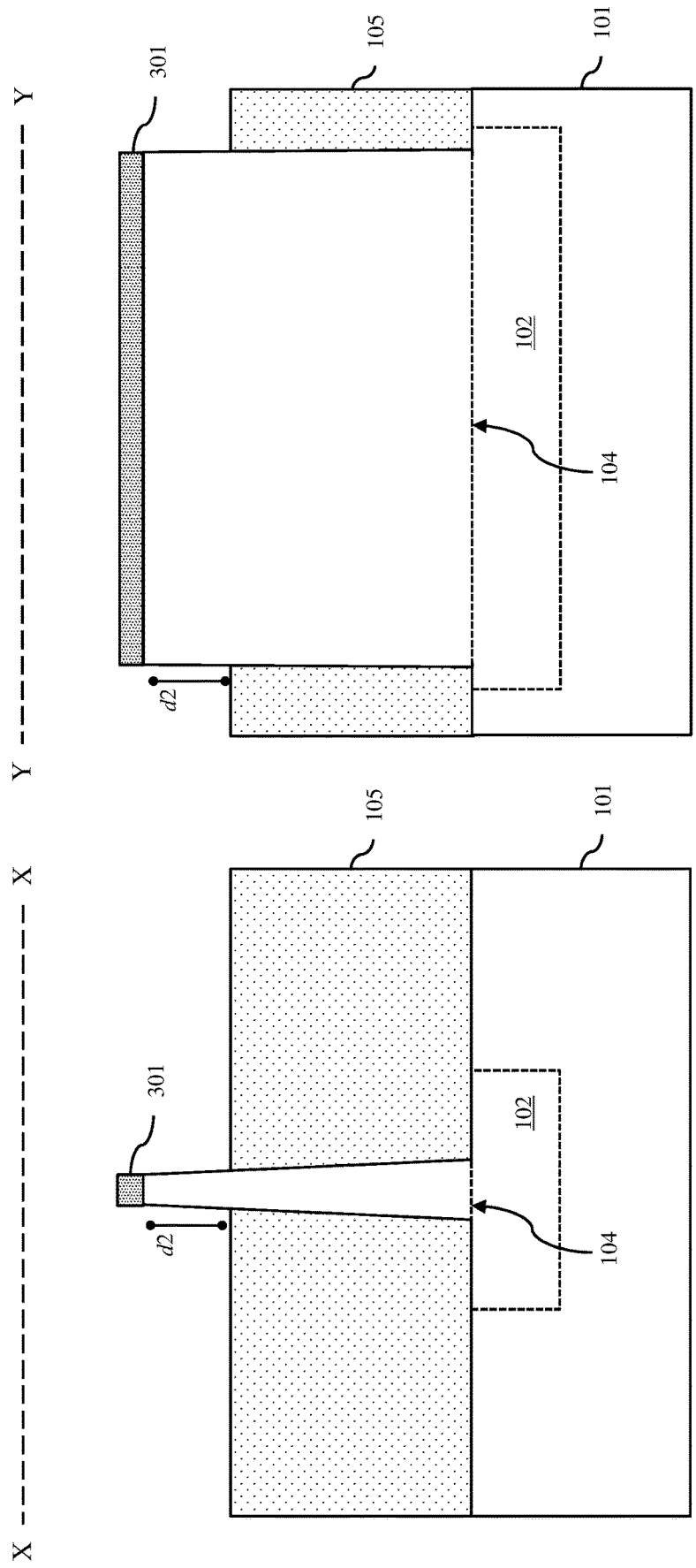

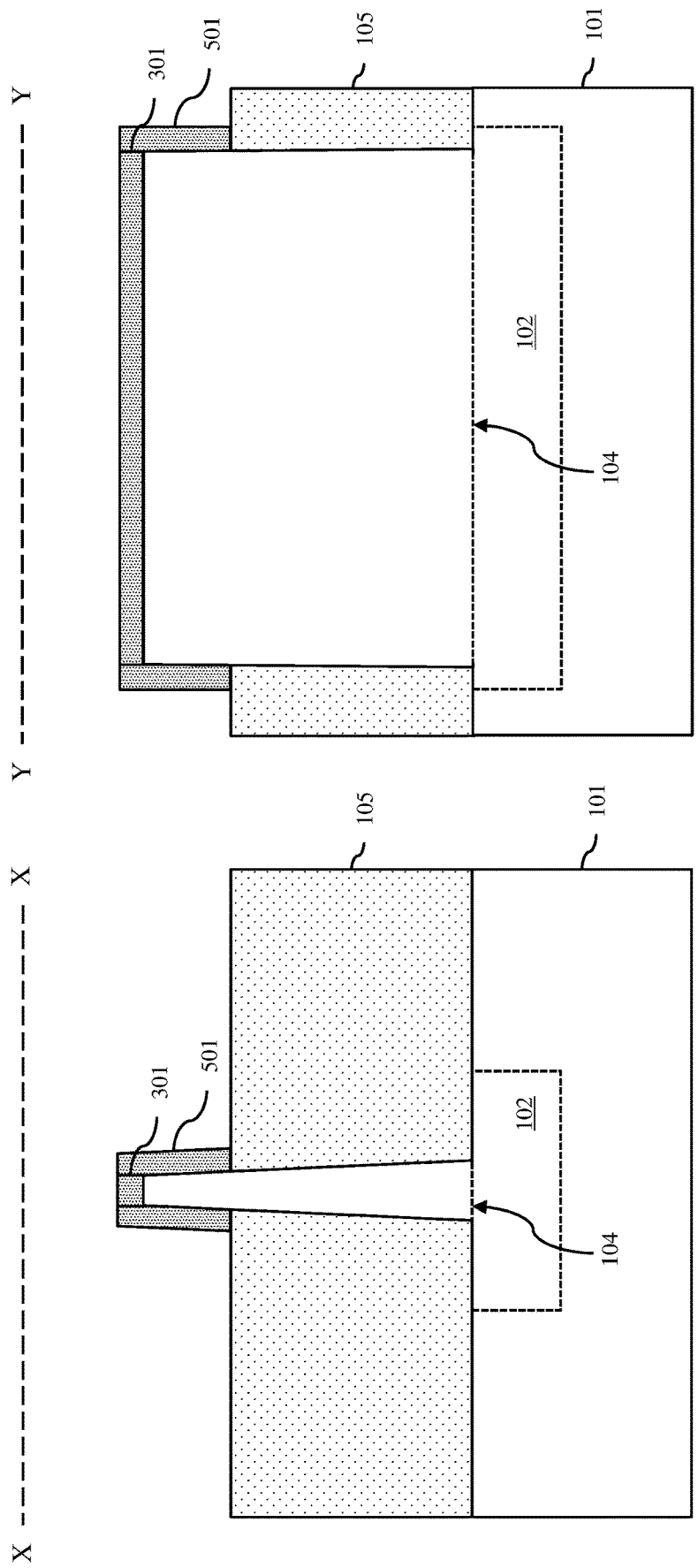

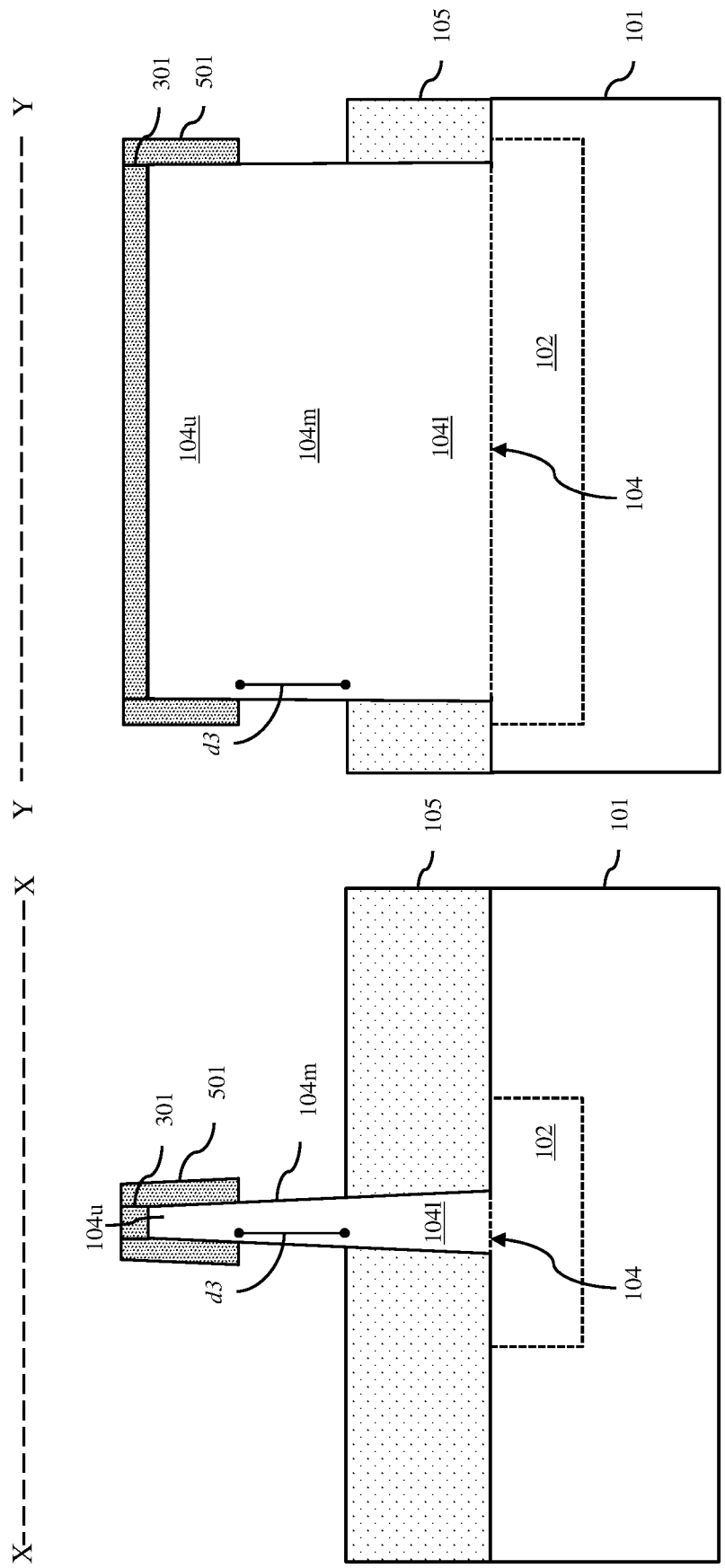

FIN-BASED LATERAL BIPOLAR JUNCTION TRANSISTOR AND METHOD

BACKGROUND

Field of the Invention

The present invention relates to semiconductor structures and, more particularly, to embodiments of a semiconductor structure including a lateral bipolar junction transistor (BJT) and to embodiments of a method of forming the semiconductor structure.

Description of Related Art

Bipolar junction transistors (BJTs) are typically formed as vertical devices (e.g., with an in-substrate collector, a base aligned above the collector, and an emitter aligned above the base). However, integration of such vertical BJTs with complementary metal oxide semiconductor (CMOS) processing and, particularly, with fin-type field effect transistor (finFET) processing, can be complex and costly.

SUMMARY

Disclosed herein are embodiments of a semiconductor structure. The semiconductor structure can include a lateral bipolar junction transistor (BJT). The BJT can include a base positioned laterally between a collector and an emitter. The base can include a semiconductor fin. This semiconductor fin can have a first portion that extends upwards from a semiconductor substrate through an isolation layer, a second portion on the first portion, and a third portion on the second portion. The collector and the emitter can be on the isolation layer positioned laterally immediately adjacent to opposing sidewalls, respectively, of the second portion of the semiconductor fin. The semiconductor structure can further include a dielectric layer on the collector and the emitter and further positioned laterally adjacent to opposing sidewalls of the third portion of the semiconductor fin.

In some embodiments, the lateral BJT can specifically be a heterojunction bipolar transistor (HBT) for improved performance. Specifically, the semiconductor structure can include an HBT. The HBT can include a base positioned laterally between a collector and an emitter. The base can include a semiconductor fin. This semiconductor fin can have a first portion that extends upwards from a semiconductor substrate through an isolation layer, a second portion on the first portion, and a third portion on the second portion. The first and third portions of the semiconductor fin can be made of a first semiconductor material (e.g., silicon), whereas at least one section of the second portion of the semiconductor fin can be made of a second semiconductor material (e.g., silicon germanium) that is different from the first semiconductor material. The collector and the emitter can be on the isolation layer positioned laterally immediately adjacent to opposing sidewalls, respectively, of the second portion of the semiconductor fin. The collector and the emitter can be made of the first semiconductor material (e.g., silicon). The semiconductor structure can further include a dielectric layer on the collector and the emitter and further positioned laterally adjacent to opposing sidewalls of the third portion of the semiconductor fin.

Method embodiments for forming the above-described semiconductor structure can include forming a semiconductor fin and further forming a bipolar junction transistor (BJT) using the semiconductor fin. The BJT can be formed so that the base includes the semiconductor fin, which has a first portion that extends upwards from a semiconductor substrate through an isolation layer, a second portion on the first portion, and a third portion on the second portion. The BJT can further be formed so that the collector and the emitter are on the isolation layer positioned laterally immediately adjacent to opposing sidewalls, respectively, of the second portion of the semiconductor fin. The method embodiments can also include forming a dielectric layer on the collector and the emitter and further over the third portion of the semiconductor fin (which extends above the level of the collector and the emitter). In some embodiments, the lateral BJT can be formed as a heterojunction bipolar transistor (BJT) for improved performance. In these embodiments, the semiconductor fin is initially made of a first semiconductor material (e.g., silicon) and, before the BJT is formed, the semiconductor fin can be processed so that the first and third portions remain the first semiconductor material, while at least a section of the second portion is converted from the first semiconductor material into a second semiconductor material (e.g., silicon germanium) that is different from the first semiconductor material. In these method embodiments, the collector and the emitter can be formed so that they are made of the first semiconductor material (e.g., silicon).

BRIEF DESCRIPTION OF THE SEVERAL VIEWS OF THE DRAWINGS

The present invention will be better understood from the following detailed description with reference to the drawings, which are not necessarily drawn to scale and in which:

FIG. 2 is a flow diagram illustrating embodiments of a method of forming a semiconductor structure with a fin-based lateral BJT;

FIG. 3A and FIG. 3B-1 or, alternatively, FIG. 3B-2 are cross-section diagrams illustrating a partially completed semiconductor structure formed according to the flow diagram of FIG. 2;

FIG. 4A and FIG. 4B-1 or, alternatively, FIG. 4B-2 are cross-section diagrams illustrating a partially completed semiconductor structure formed according to the flow diagram of FIG. 2;

FIG. 5A and FIG. 5B-1 or, alternatively, FIG. 5B-2 are cross-section diagrams illustrating a partially completed semiconductor structure formed according to the flow diagram of FIG. 2;

FIG. 6A and FIG. 6B-1 or, alternatively, FIG. 6B-2 are cross-section diagrams illustrating a partially completed semiconductor structure formed according to the flow diagram of FIG. 2;

FIG. 7A and FIG. 7B-1 or, alternatively, FIG. 7B-2 are cross-section diagrams illustrating a partially completed structure formed according to the flow diagram of FIG. 2;

FIG. 8A and FIG. 8B-1 or, alternatively, FIG. 8B-2 are cross-section diagrams illustrating a partially completed semiconductor structure formed according to the flow diagram of FIG. 2;

FIG. 9A and FIG. 9B-1 or, alternatively, FIG. 9B-2 are cross-section diagrams illustrating a partially completed semiconductor structure formed according to the flow diagram of FIG. 2;

FIG. 10A and FIG. 10B-1 or, alternatively, FIG. 10B-2 are cross-section diagrams illustrating a partially completed semiconductor structure formed according to the flow diagram of FIG. 2;

FIG. 12A and FIG. 12B-1 or, alternatively, FIG. 12B-2 are cross-section diagrams illustrating a partially completed semiconductor structure formed according to the flow diagram of FIG. 2; and FIG. 13A and FIG. 13B-1 or, alternatively, FIG. 13B-2 are cross-section diagrams illustrating a semiconductor structure formed according to the flow diagram of FIG. 2.

DETAILED DESCRIPTION

As mentioned above, bipolar junction transistors (BJTs) are typically formed as vertical devices (e.g., with an in-substrate collector, a base aligned above the collector, and an emitter aligned above the base). However, integration of such vertical BJTs with complementary metal oxide semiconductor (CMOS) processing and, particularly, with fin-type field effect transistor (finFET) processing, can be complex and costly.

In view of the foregoing, disclosed herein are embodiments of a semiconductor structure including a lateral bipolar junction transistor (BJT). The BJT can include a base positioned laterally between a collector and an emitter. The base can include a semiconductor fin that has three portions: a first portion, which extends essentially vertically from a semiconductor substrate through an isolation layer, a second portion on the first portion, and a third portion on the second portion. The collector and the emitter can be on the isolation layer positioned laterally immediately adjacent to opposing sidewalls, respectively, of the second portion of the semiconductor fin. The collector, emitter, and the third portion of the semiconductor fin (which extends vertically above the emitter and collector) can be covered by a dielectric layer. Such a BJT can be readily integrated with finFET process. In some embodiments, the BJT can be a conventional BJT. In other embodiments, the BJT can be a heterojunction bipolar transistor (HBT) where the second portion of the semiconductor fin (i.e., of the base) is made of a different semiconductor material than the collector and the emitter for improved performance (e.g., higher fT/fmax and beta cut-off frequency). Also disclosed herein are method embodiments for forming the disclosed semiconductor structure.

Figure 1A:
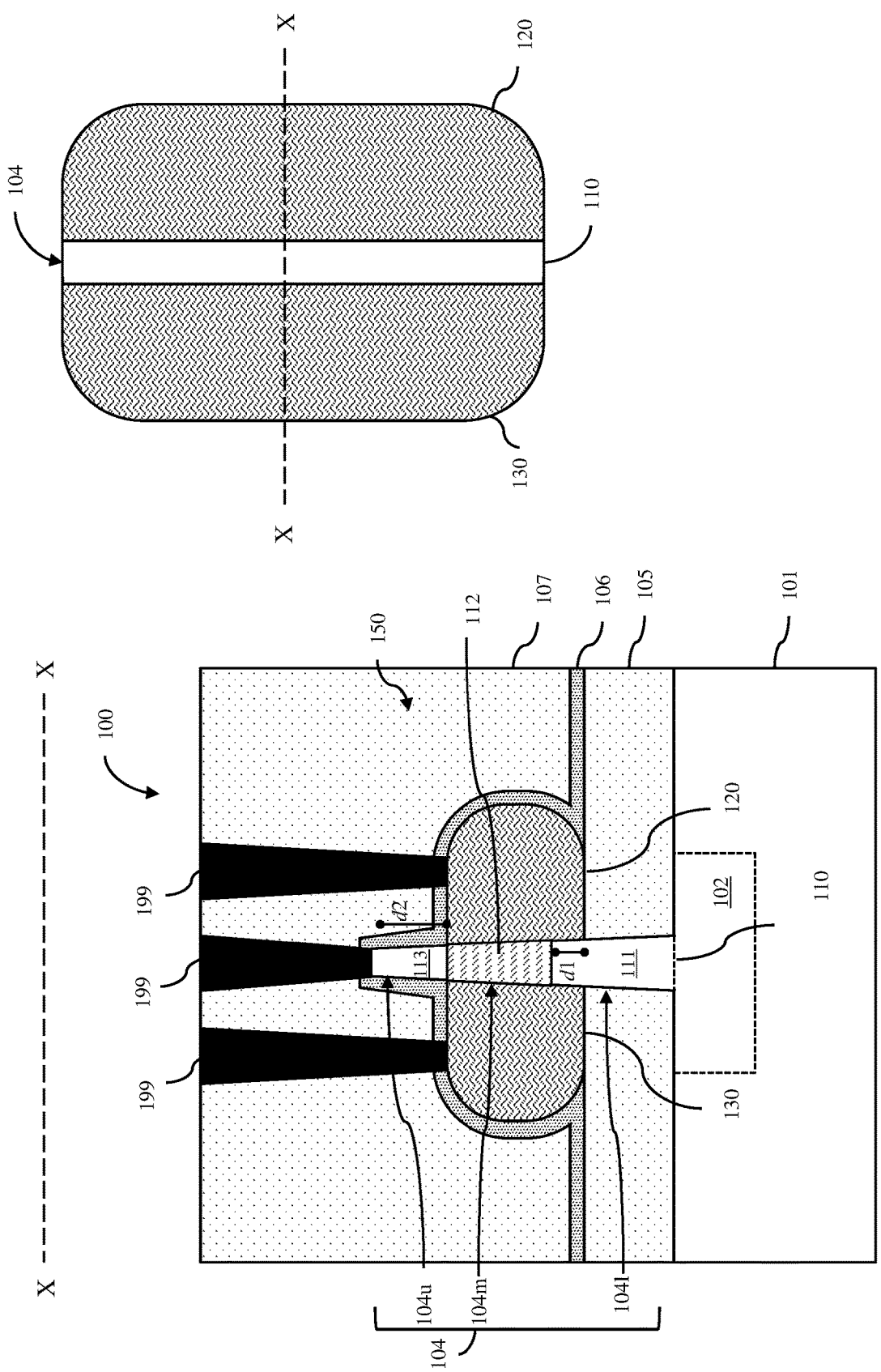
FIG. 1A is a cross-section diagram illustrating embodiments of a semiconductor structure including a lateral bipolar junction transistor (BJT) on a semiconductor fin, where the cross-section is cut across the width of the semiconductor fin.
Figures 1, 1B:
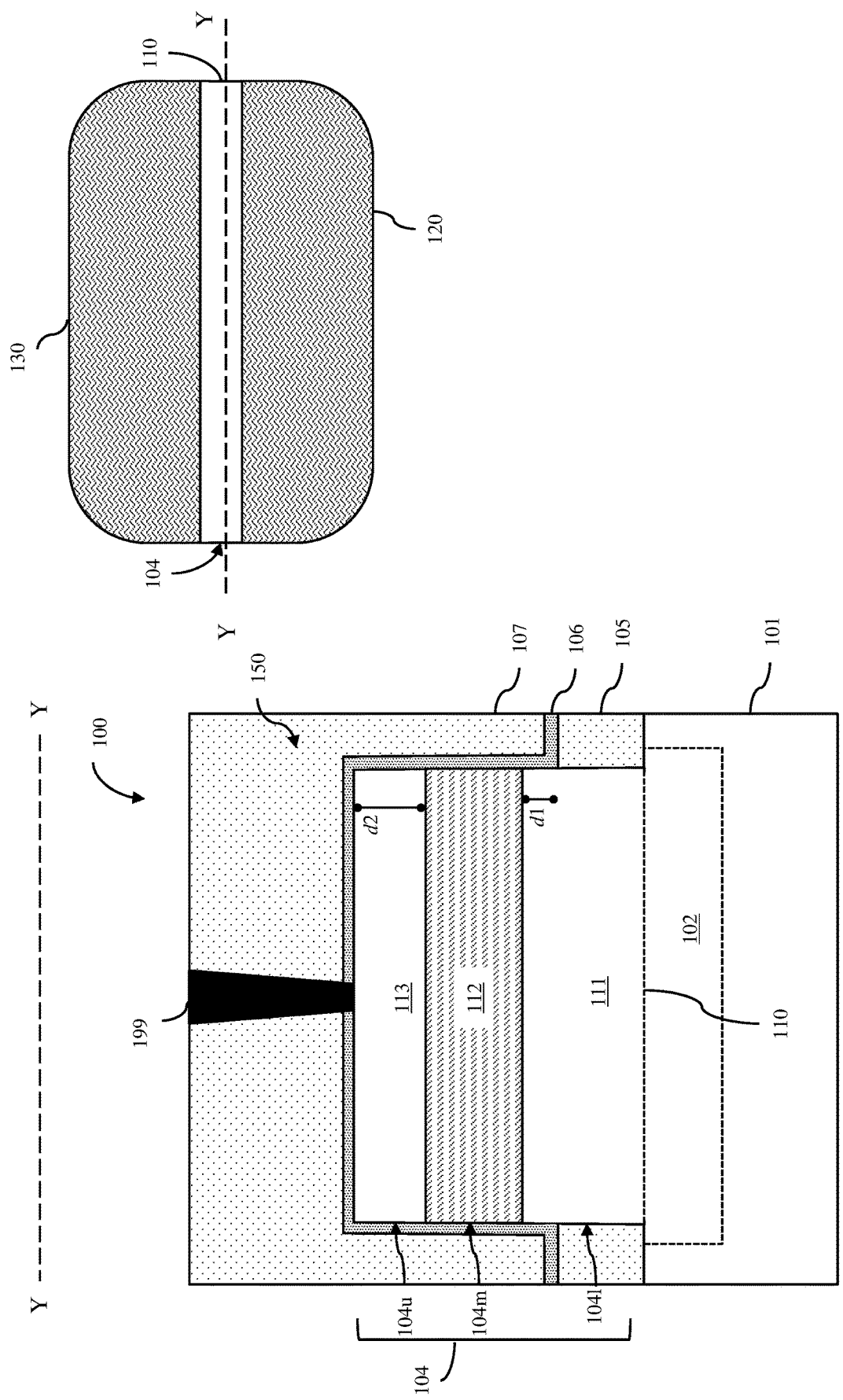
FIG. 1B-1 and FIG. 1B-2 are cross-section diagrams illustrating alternative embodiments of the same semiconductor structure with the cross-sections cut across the length of the semiconductor fin.
Figures 1, 1B, 2:
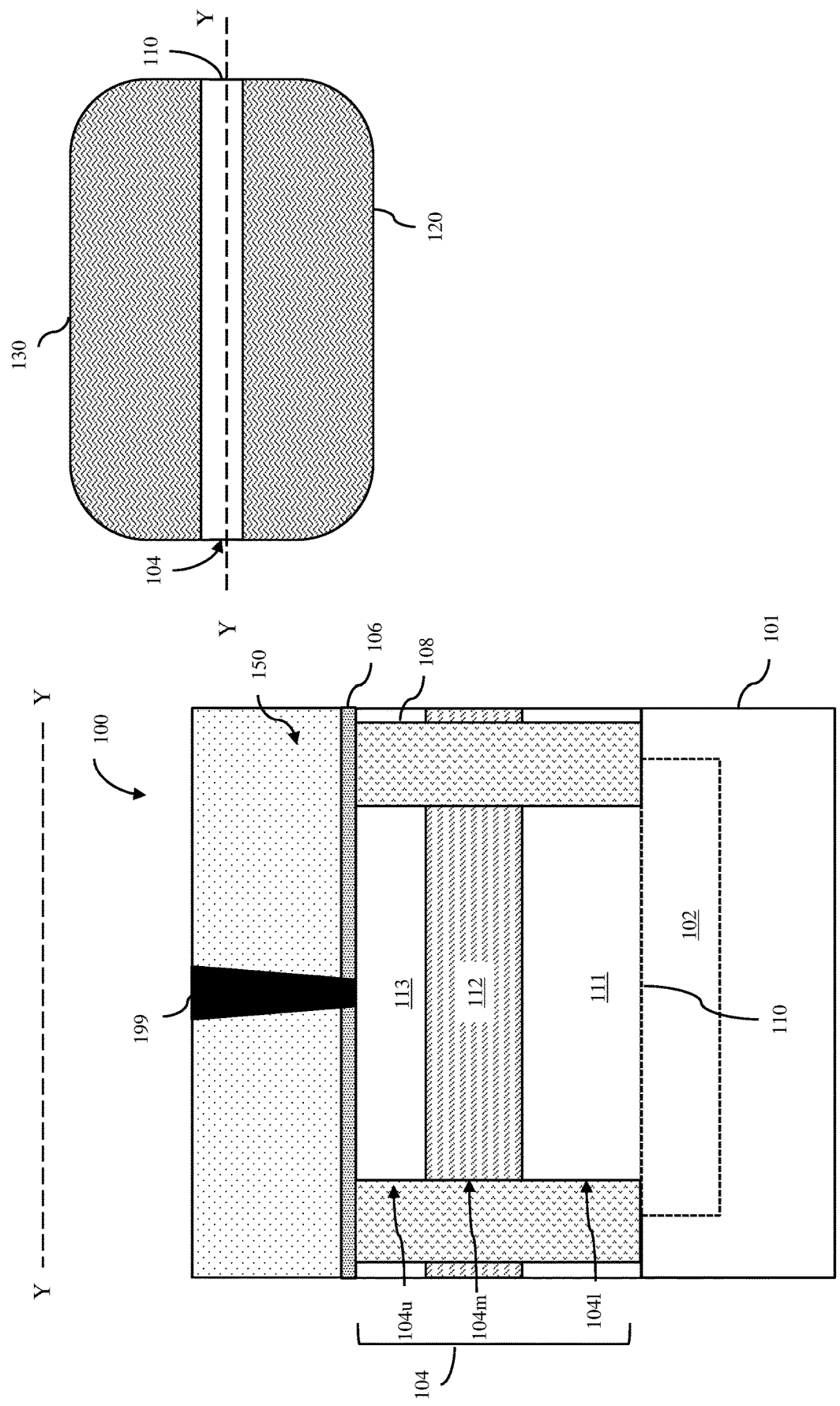
Figure 2:
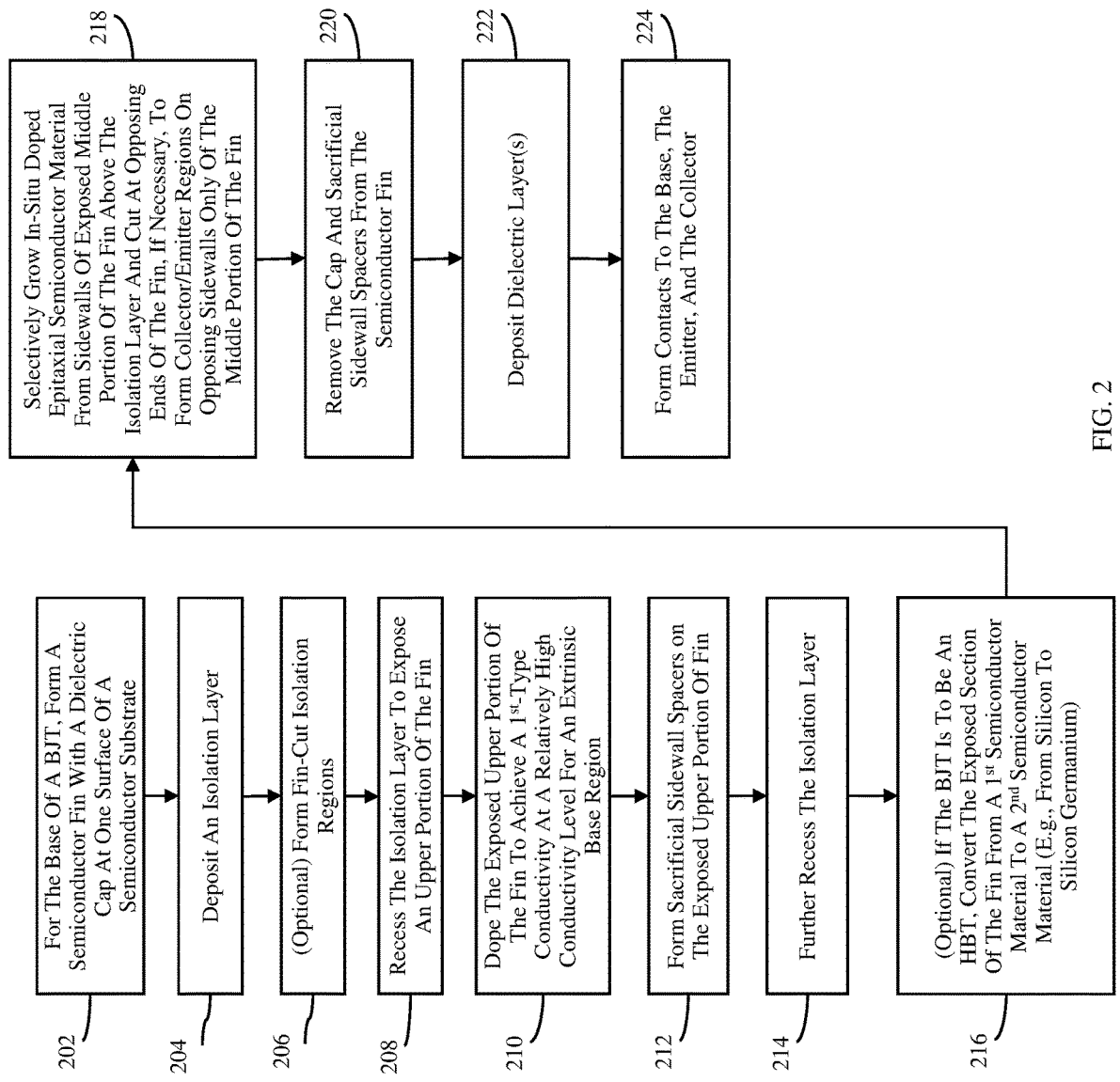

More particularly, disclosed herein are embodiments of a semiconductor structure 100 including a lateral bipolar junction transistor (BJT) 150 formed using a semiconductor fin 104 (see FIG. 1A and FIG. 1B-1 or 1B-2). FIG. 1A is a cross-section diagram illustrating the semiconductor structure 100 cut across the width of the semiconductor fin 104. FIG. 1B-1 is a cross-section diagram illustrating the semiconductor structure 100 cut along the length of the semiconductor fin 104. FIG. 1B-2 is an alternative cross-section diagram illustrating the semiconductor structure 100 cut along the length of the semiconductor fin 104 and including fin-cut isolation regions 108.

Referring to FIG. 1A and FIG. 1B-1 or FIG. 1B-2, the semiconductor structure 100 can include a semiconductor substrate 101. The semiconductor substrate 101 can be, for example, a bulk semiconductor substrate, such as a bulk monocrystalline silicon substrate. Optionally, the semiconductor substrate 101 can be doped so as to have P-type conductivity at a relatively low conductivity level (e.g., so as to be a P– semiconductor substrate, such as a P– silicon substrate).

The semiconductor structure 100 can further include a semiconductor fin 104. Specifically, the semiconductor substrate 101 can have a first surface (e.g., a bottom surface) and a second surface (e.g., a top surface) opposite the first surface. The semiconductor fin 104 can extend, essentially vertically, upwards from the second surface of the semiconductor substrate 101. For purposes of this disclosure, a "semiconductor fin" refers to a relatively thin, elongated, semiconductor body. Ideally, a semiconductor fin will have a three-dimensional rectangular shape with a uniform width from the bottom of the semiconductor fin adjacent to the substrate to the top of the semiconductor fin. However, those skilled in the art will recognize that semiconductor fins are typically formed using a selective anisotropic etch process and, as a result of this process, the sidewalls of the semiconductor fins may not be exactly vertical (i.e., perpendicular to the bottom surface of the substrate) and the fin width may be somewhat non-uniform (e.g., wider proximal to the substrate).

In some embodiments, as illustrated in FIG. 1B-1, the semiconductor fin 104 can be a discrete fin structure that, during processing, has been discretely patterned and etched into the semiconductor substrate 101. In other embodiments, as illustrated in FIG. 1B-2, the semiconductor fin 104 can, alternatively, be one section of an elongated semiconductor fin that has been patterned and etched into the semiconductor substrate and further cut into sections separated by fin-cut isolation regions 108. Thus, as illustrated in FIG. 1B-2 the semiconductor fin 104 extends laterally between fin-cut isolation regions 108 (i.e., the opposing ends of the semiconductor fin 104 are immediately adjacent to fin-cut isolation regions 108). In any case, the semiconductor fin 104 can have a first portion 104l (also referred to herein as a lower portion) proximal to the semiconductor substrate 101, a second portion 104m (also referred to herein as a middle portion) on the first portion 104l, and a third portion 104u (also referred to herein as an upper portion) on the second portion 104m and distal to the semiconductor substrate 101. Like the semiconductor substrate 101, the semiconductor fin 104 and, particularly, each of the three portion 104l, 104m, and 104u thereof can be monocrystalline in structure.

In some embodiments and, particularly, in embodiments where the lateral BJT 150 is a conventional BJT, the entire semiconductor fin 104, including all three portions 104l, 104m and 104u) can be made of the same semiconductor material and, particularly, a first semiconductor material (e.g., silicon). In other embodiments and, particularly, in embodiments where the lateral BJT 150 is an HBT, the first portion 104l and the third portion 104u of the semiconductor fin 104 can be made of a first semiconductor material (e.g., silicon), but at least a section and, particularly, at least an upper section of the second portion 104m of the semiconductor fin 104 between the first and third portions can be made of a second semiconductor material (e.g., silicon germanium) that is different from the first semiconductor material.

The semiconductor structure 100 can further include an isolation layer 105 on the semiconductor substrate 101 and positioned laterally adjacent to the first portion 104l of the semiconductor fin 104. In embodiments without fin-cut isolation regions (e.g., as illustrated in FIG. 1B-1) the isolation layer 105 can laterally surround the first portion 104*l* of the semiconductor fin 104 and, particularly, can be immediately adjacent to the opposing sides and the opposing ends of the first portion 104*l*. In embodiments with fin-cut isolation regions 108 (e.g., as illustrated in FIG. 1B-2) the isolation layer 105 can be positioned laterally immediately adjacent to the opposing sides only of the first portion 104*l*.

The isolation layer 105 can include one or more layers of isolation material. For example, the isolation layer 105 could be a single isolation layer (e.g., a single silicon dioxide layer or a single layer of some other suitable isolation material), as illustrated. Alternatively, the isolation layer 105 could include multiple different isolation layers (e.g., conformal isolation layer(s) and a blanket isolation layer on the conformal isolation layer(s)). As illustrated in FIG. 1A, the semiconductor fin 104 can extend through the isolation layer 105 such that the second and third portions of the semiconductor fin are above the level of the top surface of the isolation layer 105. It should be noted that, in some embodiments due to the processing techniques used, the second semiconductor material section of the second portion 104*m* of the semiconductor fin 104 can be some first distance (d1) above the first portion 104*l* (i.e., above the level of the top surface of the isolation layer 105).

As mentioned above the semiconductor structure 100 can include a lateral bipolar junction transistor (BJT) 150 and this lateral BJT 150 can be either a conventional BJT or an HBT. Those skilled in the art will recognize that a BJT typically includes three terminals: a collector, an emitter, and a base between the collector and the emitter. In a vertical BJT, the collector, base and emitter are stacked vertically. In a lateral BJT, the base is positioned laterally between the collector and the emitter. In any case, the base will include at least an extrinsic base region having a first-type conductivity and the collector and the emitter will have a second-type conductivity that is different from the first-type conductivity. Thus, an NPN-type BJT will include at least P-type extrinsic base, an N-type collector, and an N-type emitter; whereas a PNP-type BJT will include at least an N-type extrinsic base, a P-type collector and a P-type emitter. In a conventional BJT, the same semiconductor material (e.g., silicon) is used for the base, collector and emitter. Alternatively, different semiconductor materials could be used. In this case, the BJT is referred as a heterojunction bipolar transistor (HBT). Those skilled in the art will recognize that a heterojunction bipolar transistor (HBT) is BJT in which the collector and emitter are made, at least in part, of one semiconductor material and the base is made, at least in part, of a different semiconductor material. The use of differing semiconductor materials at the emitter-base junction and at base-collector junction creates heterojunctions suitable for handling higher frequencies.

Whether the lateral BJT 150 is a conventional BJT or an HBT, it can include three terminals: a collector 130, an emitter 120, and a base 110 positioned laterally between the collector 130 and the emitter 120.

The base 110 can include the semiconductor fin 104. As mentioned above, the semiconductor fin 104 can have a first portion 104*l* that extends through the isolation layer 105, a second portion 104*m* on the first portion 104*l*, and a third portion 104*u* on the second portion 104*m*. For a conventional BJT, all three portions 104*l*, 104*m* and 104*u* can be made of the same first semiconductor material (e.g., silicon). For an HBT, the first portion 104*l* and the third portion 104*u* can be made of the same first semiconductor material (e.g., silicon), but at least a section and, particularly, at least an upper section of the second portion 104*m* can be made of a second semiconductor material (e.g., silicon germanium) that is different from the first semiconductor material. For either a conventional BJT or an HBT, the first portion 104*l* of the semiconductor fin 104 can be doped so as to have a first-type conductivity at a relatively low conductivity level. The third portion 104*u* of the semiconductor fin 104 can be doped so as to have the same first-type conductivity at a relatively high conductivity level. The second portion 104*m* of the semiconductor fin 104 can be doped so as to have the first-type conductivity at the same relatively low conductivity level as the first portion 104*l*, so as to have the first-type conductivity at the same relatively high conductivity level as the third portion 104*u*, so as to have a graded first-type conductivity profile (e.g., from the low conductivity level near the first portion to the high conductivity level near the third portion), or so as to have some other first-type conductivity profile. The first, second and third portions 104*l*, 104*m* and 104*u* of the semiconductor fin 104 can make up first, second and third regions 111-113 of the base 110 and the third region 113 of the base 110 can specifically be a highly doped extrinsic base region.

The collector 130 and the emitter 120 can be above the isolation layer 105 (e.g., on the top surface of the isolation layer 105) positioned laterally immediately adjacent to opposing sidewalls, respectively, of the second portion 104*m* of the semiconductor fin 104 (i.e., of the second region 112 of the base 110). The collector 130 and the emitter 120 can be layers of epitaxial semiconductor material grown laterally and selectively during processing from exposed sidewalls of the second portion 104*m* of the semiconductor fin 104 such that they are monocrystalline in structure. The epitaxial semiconductor material can be the first semiconductor material (e.g., silicon) and can be doped (e.g., in situ doped) so as to have a second-type conductivity at a relatively high conductivity level. Thus, the collector 130 and the emitter 120 have the second-type conductivity at the relatively high conductivity level.

It should be understood that the second-type conductivity is different from the first-type conductivity. Furthermore, it should be understood that the first-type conductivity and the second-type conductivity are different depending upon whether the lateral BJT 150 is an NPN-type lateral BJT or a PNP-type lateral BJT. Specifically, for an NPN-type lateral BJT, the first-type conductivity can be a P-type conductivity and the second-type conductivity can be N-type conductivity, whereas for a PNP-type lateral BJT, the first-type conductivity can be an N-type conductivity and the second-type conductivity can be P-type conductivity. Thus, for example, if the lateral BJT 150 is an NPN-type lateral BJT, the first portion 104*l* of the semiconductor fin 104 can be doped so as to have P− conductivity, the third portion 104*u* of the semiconductor fin 104 can be doped so as to have P+ conductivity (i.e., to be the P+ extrinsic base region), and the second portion 104*m* of the semiconductor fin 104 can be doped so as to have P− conductivity, P+ conductivity, or so as to have a graded P-type conductivity profile (e.g., from the P− near the first portion to the P+ near the third portion) or some other P-type conductivity profile. Additionally, the collector 130 and the emitter 120 can be doped so as to be an N+ collector and an N+ emitter, respectively. However, if the lateral BJT 150 is a PNP-type lateral BJT, the first portion 104*l* of the semiconductor fin 104 can be doped so as to have N− conductivity, the third portion 104*u* of the semiconductor fin 104 can be doped so as to have N+ conductivity (i.e., to be the N+ extrinsic base region), and the second portion 104*m* of the semiconductor fin 104 can be doped so as to have N− conductivity, N+ conductivity, or so as to have a graded P-type conductivity profile (e.g., from the P− near the first portion to the P+ near the third portion) or some other N-type conductivity profile. Additionally, the collector 130 and the emitter 120 can be doped so as to be a P+ collector and a P+ emitter, respectively.

It should be noted that the lateral BJT 150 can be electrically isolated from the lower portion of the semiconductor substrate 101 and thereby from other devices on the semiconductor substrate 101. Isolation can be achieved, for example, with the inclusion of a well region 102 (also referred to herein as a dopant implant region) within the semiconductor substrate 101 aligned below the semiconductor fin 104. For example, as mentioned above, the semiconductor substrate 101 can be a P− semiconductor substrate and if the lateral BJT 150 is an NPN-type lateral BJT, the semiconductor fin 104 (i.e., the base 110) will also be P-doped. In this case, a well region 102 aligned below the semiconductor fin 104 can specifically be an Nwell in order to electrically isolate the P-type base region 110 from the P− semiconductor substrate and from other devices thereon.

As illustrated, the third portion 104*u* of the semiconductor fin 104 (i.e., the third region 113 of the base 110) extends a second distance (d2) above the second portion 104*m* of the semiconductor fin 104 (i.e., above the second region 112 of the base 110) and, thus, above the level of the tops of the collector 130 and the emitter 120.

The semiconductor structure 100 can further include a conformal first dielectric layer 106. The conformal first dielectric layer 106 can be on the top surface of the isolation layer 105, can cover the collector 130, can extend up and over the third portion 104*u* of the semiconductor fin 104 (i.e., the third region 113 of the base 110), and can further cover the emitter 120, as illustrated in FIG. 1A. This conformal first dielectric layer 106 can be, for example, a relatively thin, conformal silicon nitride layer. Alternatively, the conformal first dielectric layer 106 can include one or more conformal layers of any suitable dielectric material(s). In embodiments without fin-cut isolation regions (e.g., as illustrated in FIG. 1B-1), the conformal first dielectric layer 106 can further be immediately adjacent to the opposing ends of the second and third portions 104*m*-104*u* and can cover the top surface of the semiconductor fin 104. In embodiments with fin-cut isolation regions 108 (e.g., as illustrated in FIG. 1B-2), the conformal first dielectric layer 106 can cover the top surface of the semiconductor fin 104 but is not adjacent to the opposing ends of the semiconductor fin (which are covered by the fin-cut isolation regions 108, as discussed above).

The semiconductor structure 100 can further include one or more second dielectric layers 107 on the conformal first dielectric layer 106. The second dielectric layer(s) can include, for example, a blanket dielectric layer (e.g., a blanket silicon dioxide layer or a blanket layer of some other suitable dielectric material).

The lateral BJT 150, as described above, is designed so as to prevent shorting between the collector 130 and the emitter 120. With the configuration shown in FIG. 1B-1, the collector 130 and the emitter 120 are electrically isolated from each other by the isolation layer 105 and by the dielectric layers 106 and 107 at the opposing ends of the semiconductor fin 104. With the configuration shown in FIG. 1B-2, the collector 130 and the emitter 120 are electrically isolated from each other by fin-cut isolation regions 108. It should be understood, however, that the figures are provided for illustration purposes and are not intended to be limiting. Alternatively, some other structural configuration could be employed to ensure that the collector 130 and the emitter 120 are not electrically connected at the opposing ends of the semiconductor fin 104.

The semiconductor structure 100 can further include middle of the line (MOL) contacts 199 including contacts extending through the dielectric layer(s) 107 and 106 to the base 110 (and, particularly, to the extrinsic base region 113), to the collector 130, and to the emitter 120.

Referring to the flow diagram of FIG. 2 and FIGS. 3A and 3B-1 or 3B-2 to FIGS. 13A and 13B-1 or 13B-2, also disclosed herein are method embodiments for forming the above-described semiconductor structure 100 that includes a lateral bipolar junction transistor (BJT) 150 (which is either a conventional BJT or a heterojunction bipolar transistor (HBT)) formed using a semiconductor fin.

It should be noted that each "A" designated figure is a cross-section diagram illustrating partially completed structure cut across the width of the semiconductor fin. Each "B-1" designated figure is a cross-section diagram illustrating the same partially completed structure cut along the length of the semiconductor fin. Each "B-2" designated figure is an alternative cross-section diagram illustrating the same partially completed structure cut along the length of the semiconductor fin.

The method embodiments can begin with a semiconductor substrate 101. The semiconductor substrate 101 can be, for example, a bulk semiconductor substrate, such as a bulk monocrystalline silicon substrate. Optionally, the semiconductor substrate 101 can be doped so as to have P-type conductivity at a relatively low conductivity level (e.g., so as to be a P− semiconductor substrate, such as a P− silicon substrate).

Figures 1, 3B:
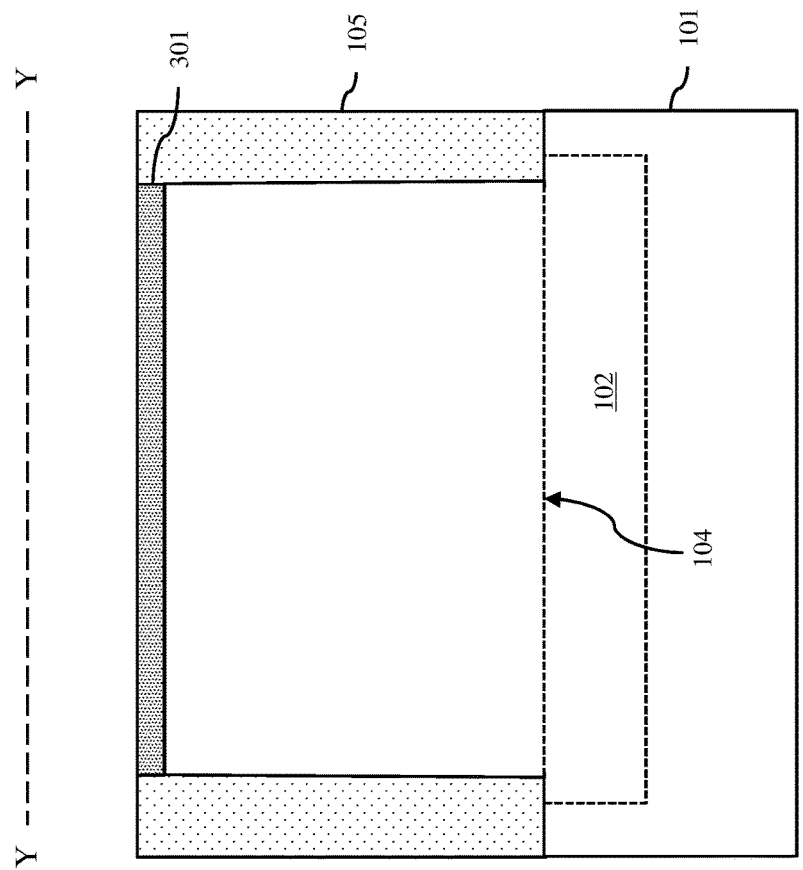
Figure 3A:
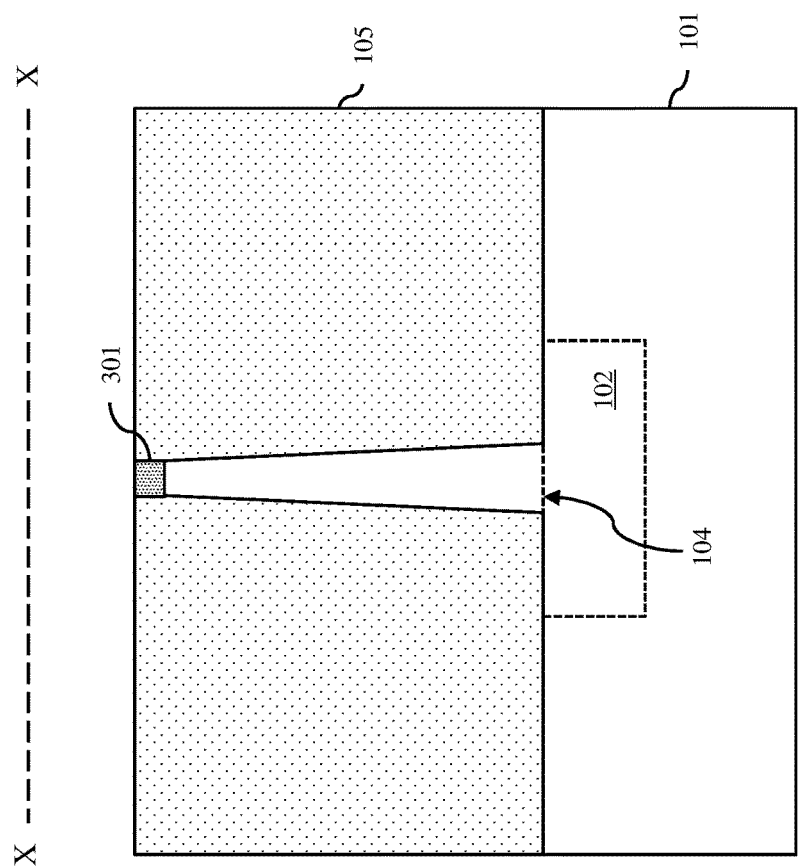
Figures 2, 3B:
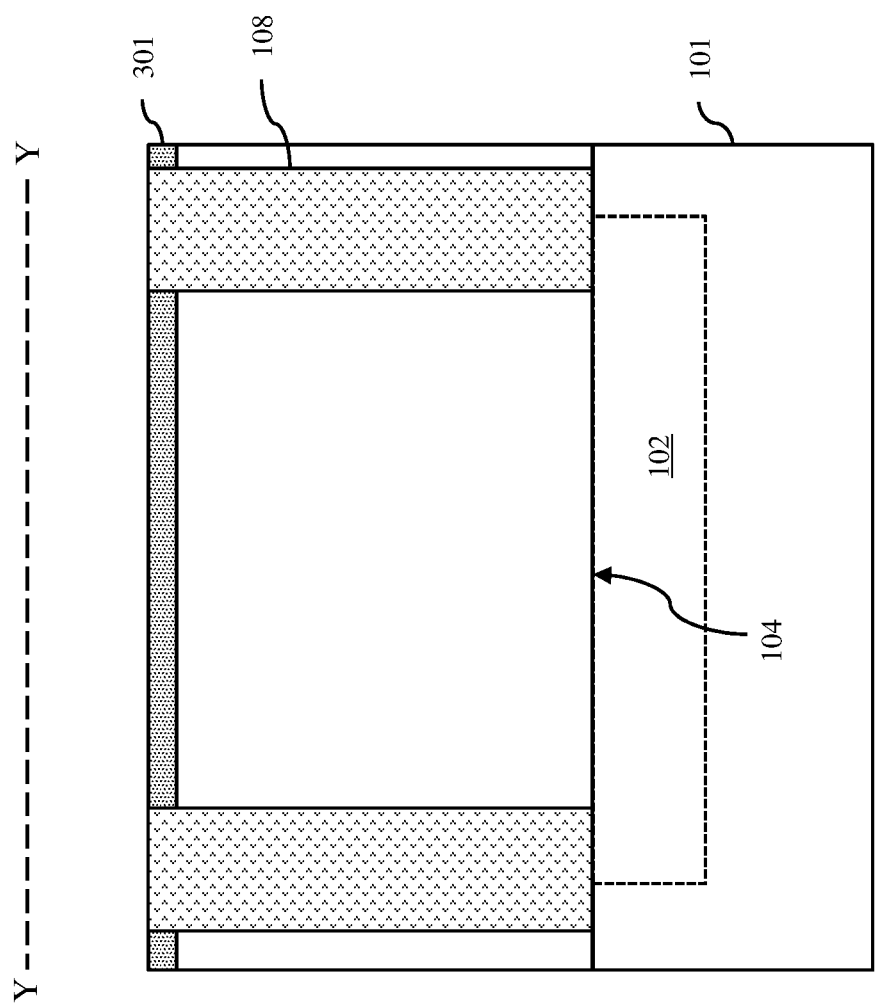
Figures 2, 4B:
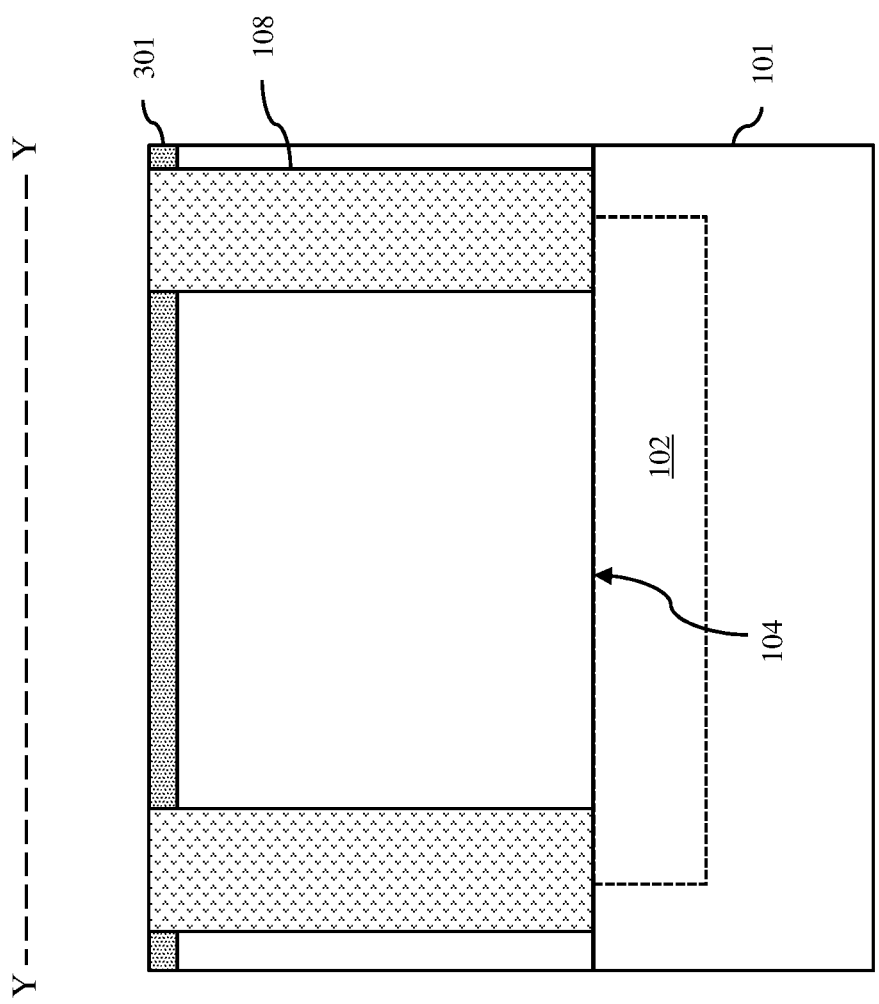
Figures 2, 5B:
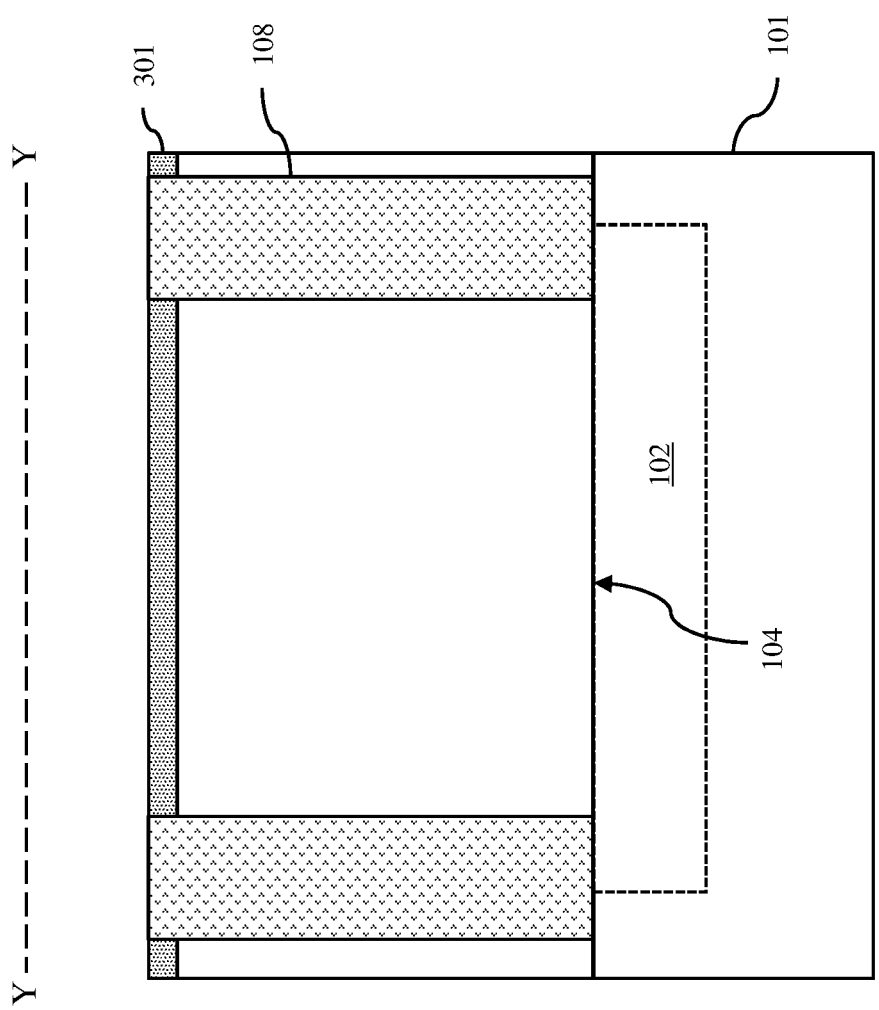
Figures 2, 6B:
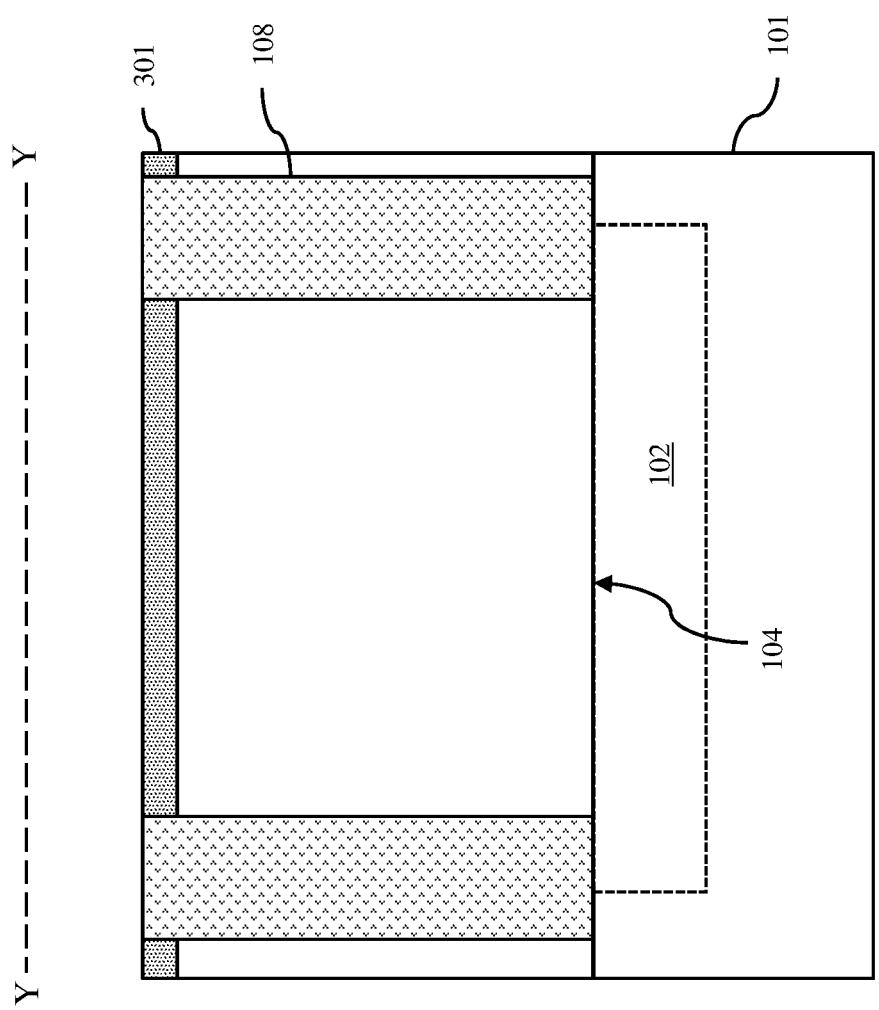

The method embodiments can further include forming a semiconductor fin for a BJT at one surface of the semiconductor substrate 101 (see process 202 and FIG. 3A). Formation of the semiconductor fin for the BJT can optionally be performed concurrently with formation of semiconductor fins for fin-type field effect transistors (finFETs). Fin(s) for BJT(s) can be formed in a BJT device area, whereas fins for finFETs can be formed in a finFET device area. In any case, conventional fin processing techniques can be employed to form semiconductor fin(s) at process 202. For example, lithographic processing techniques or sidewall image transfer (SIT) processing techniques could be employed to form fin mask(s) on the top surface of the semiconductor substrate. Such techniques are well known in the art and, thus, the details have been omitted form this specification in order to allow the reader to focus on the disclosed embodiments. Following fin mask formation, a selective anisotropic etch process can be performed in order to pattern the semiconductor fin(s) into the upper portion of the semiconductor substrate. For purposes of this disclosure, a "semiconductor fin" refers to a relatively thin, elongated, semiconductor body. Ideally, a semiconductor fin will have a three-dimensional rectangular shape with a uniform width from the bottom of the semiconductor fin adjacent to the substrate to the top of the semiconductor fin. However, those skilled in the art will recognize that semiconductor fins are typically formed using a selective anisotropic etch process and, as a result of this process, the sidewalls of the semiconductor fins may not be exactly vertical (i.e., perpendicular to the bottom surface of the substrate) and the fin width may be somewhat non-uniform (e.g., wider proximal to the substrate). It should be noted that, following process 202, a fin mask can remain in place such that the top of each semiconductor fin is capped by a dielectric cap 301 (e.g., a silicon nitride cap).

The method embodiments can further include depositing an isolation layer 105 over the semiconductor fin at process 202 (see process 204 and FIG. 3A). This isolation layer 105 can include one or more layers of isolation material. For example, the isolation layer 105 could be a single isolation layer (e.g., a single silicon dioxide layer or a single layer of some other suitable isolation material), as illustrated. Alternatively, the isolation layer 105 could include multiple different isolation layers (e.g., conformal isolation layer(s) and a blanket isolation layer on the conformal isolation layer(s)).

In some embodiments, the semiconductor fin formed at process 202 can be relatively short in length so that it, in its' entirety, can be used for the formation of the lateral BJT. In this case, the isolation layer 105 laterally surrounds the semiconductor fin and is positioned laterally immediately adjacent to the opposing sides and the opposing ends thereof, as illustrated in FIG. 3B-1.

In other embodiments, the semiconductor fin formed at process 202 can be relatively long (i.e., an elongated semiconductor fin) so that it can be used for the formation of multiple devices. In this case, fin-cut isolation regions 108 can be formed in the elongated semiconductor fin, effectively dividing the elongated semiconductor fin in to multiple smaller semiconductor fins including one semiconductor fin 104 to be used for the formation of the lateral BJT, as illustrated in FIG. 3B-2 (see process 206). In this case, the semiconductor fin 104 extends between a pair of adjacent fin-cut isolation regions 108 (i.e., the opposing ends of the semiconductor fin 104 are immediately adjacent to fin-cut isolation regions 108) such that the isolation layer 105 is only positioned laterally immediately adjacent to the opposing sides of the semiconductor fin 104 and not the opposing ends. Techniques for forming fin-cut isolation regions are well known in the art and, thus, the details thereof have been omitted from this specification in order to allow the reader to focus on the salient aspects of the disclosed methods. However, it should be noted that the isolation material used for the fin-cut isolation regions 108 should be sufficiently different from the isolation material used for the isolation layer 105 so that during subsequent processing the isolation layer 105 can be selectively etched, leaving the fin-cut isolation regions 108 essentially intact.

The lateral BJT 150 can be formed as either an NPN-type BJT or a PNP-type BJT. In the case of NPN-type BJT formation, before or after fin formation at process 202, a dopant implantation process could be performed so that a well region 102 (also referred to herein as a dopant implant region) is within the semiconductor substrate 101 aligned below the semiconductor fin 104. Such a well region 102 can be, for example, an Nwell designed to isolate a P-type semiconductor fin from a P-type semiconductor substrate. Furthermore, in the case of PNP-type BJT formation, before or after fin formation at process 202, a dopant implantation process could be performed in order to dope the semiconductor fin 104 so that the entire semiconductor fin 104 is switched to N-type conductivity at a relatively low conductivity (i.e., N− conductivity).

The terms first-type conductivity and second-type conductivity are used in the description of the remaining processes. It should be understood that the first-type conductivity and the second-type conductivity will be different depending upon whether the lateral BJT is an NPN-type or a PNP-type lateral BJT. Specifically, for NPN-type lateral BJT formation, the first-type conductivity refers to P-type conductivity and the second-type conductivity refers to N-type conductivity; whereas, for a PNP-type lateral BJT formation, the first-type conductivity refers to N-type conductivity and the second-type conductivity refers to P-type conductivity.

The method embodiments can further include recessing (i.e., etching back) the isolation layer 105 (e.g., in the BJT device area only) to expose the upper portion 104u of the semiconductor fin 104 (see process 210 and FIGS. 4A and 4B-1 or 4B-2). That is, a selective etch process can be performed in order to lower the level of the top surface of the isolation layer 105 and expose the upper portion 104u of the semiconductor fin 104. As illustrated, due to the selective nature of this etch process, the dielectric cap 301 and, if applicable, the fin-cut isolation regions 108 remain intact and the top of the semiconductor fin will be some distance (d2) above the top surface of the isolation layer 105.

The method embodiments can further include performing another dopant implantation process to dope the exposed upper portion 104u of the semiconductor fin 104 such that this upper portion 104u has the first-type conductivity at a relatively high conductivity level to create an extrinsic base region 113 (see process 208). Thus, for an NPN-type lateral BJT, the extrinsic base region 113 in the upper portion 104u of the semiconductor fin 104 will be a P+ extrinsic base region; whereas, for a PNP-type lateral BJT, the extrinsic base region 113 in the upper portion 104u of the semiconductor fin 104 will be an N+ extrinsic base region.

Next, sacrificial sidewall spacers 501 can be formed on exposed vertical surfaces of the upper portion 104u of the semiconductor fin 104 (see process 212 and FIGS. 5A and 5B-1 or 5B-2). Conventional sidewall spacer formation techniques can be used to form the sacrificial sidewall spacers 501. For example, a conformal sacrificial sidewall spacer material layer (e.g., a conformal silicon nitride layer or a conformal layer of some other suitable sacrificial sidewall spacer material) can be deposited over the partially completed structure. Then, a selective anisotropic etch process can be performed so as to selectively remove the sacrificial sidewall spacer material from horizontal surfaces, leaving it intact on vertical surfaces (i.e., positioned laterally adjacent to the vertical surfaces of the upper portion 104u of the semiconductor fin 104).

The method embodiments can include further recessing (i.e., etching back) the isolation layer 105 (see process 214 and FIGS. 6A and 6B-1 or 6B-2). That is, another selective etch process can be performed in order to further lower the level of the top surface of the isolation layer 105 without exposing the lower portion 104l of the semiconductor fin 104.

Figures 1, 7A, 7B:
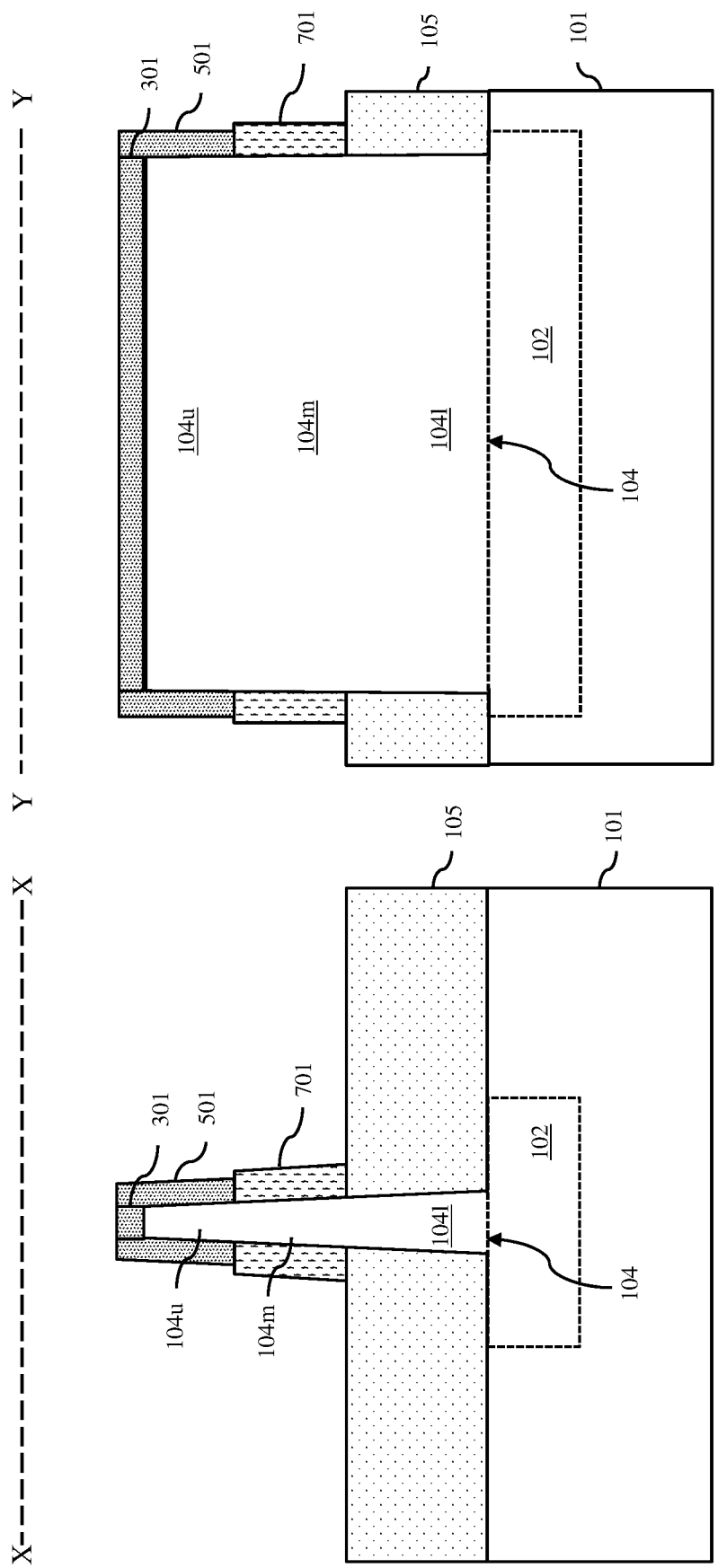
Figures 2, 7B:
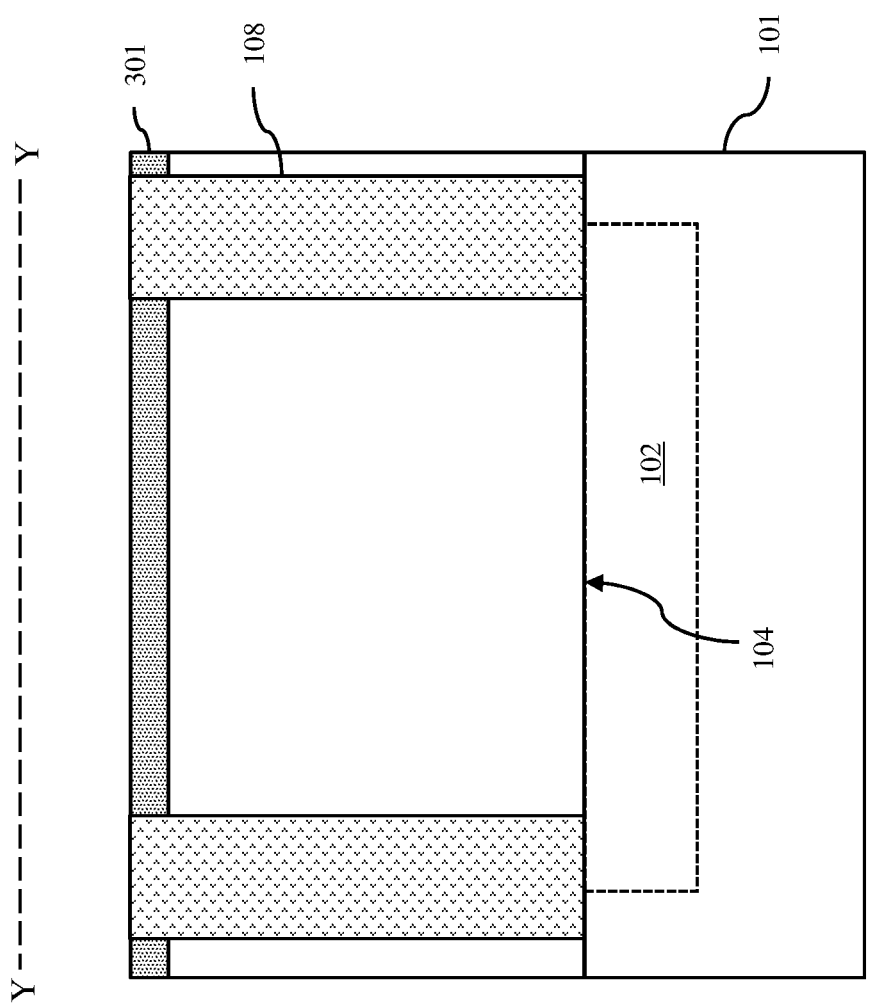
Figures 1, 8B:
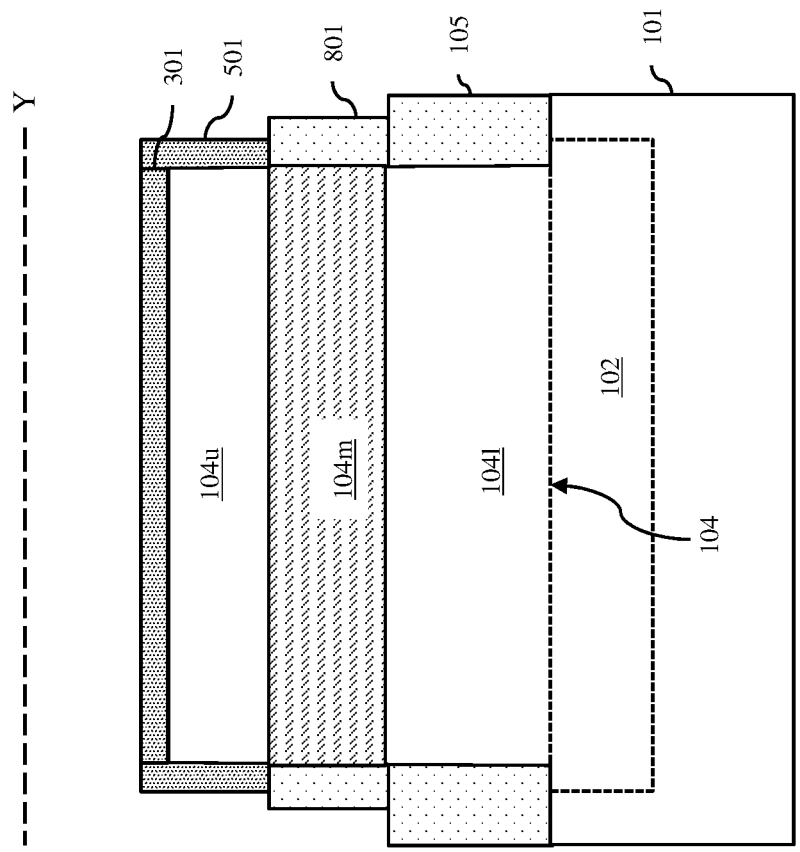
Figure 8A:
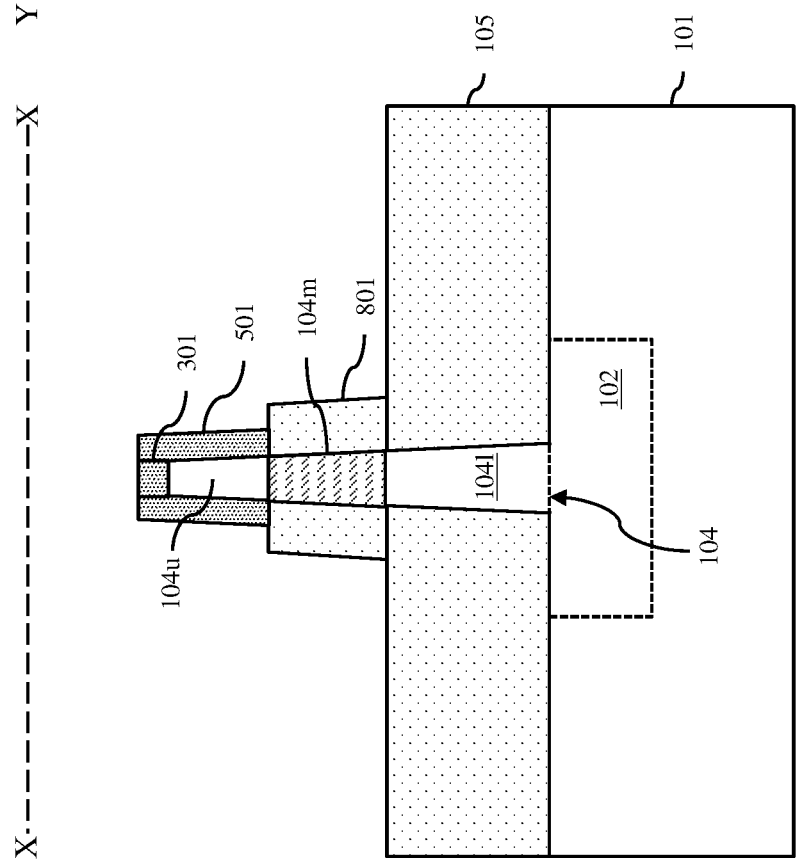
Figures 2, 8B:
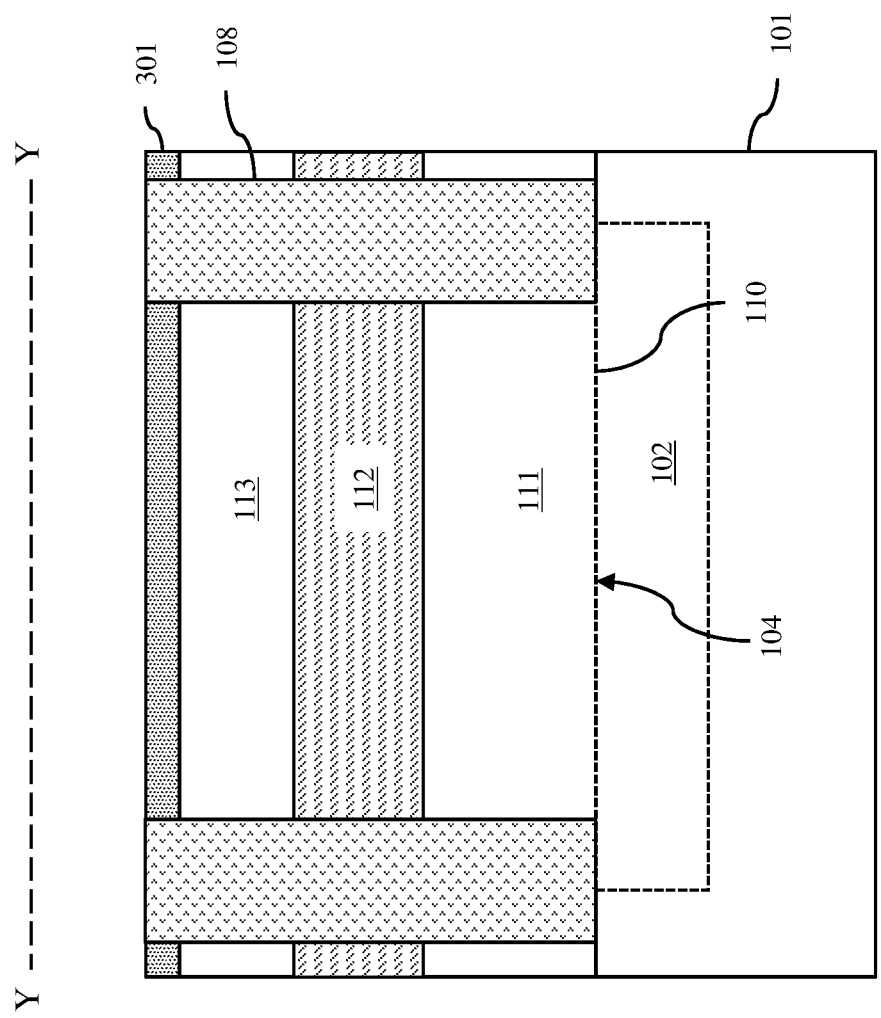
Figures 1, 9A, 9B:
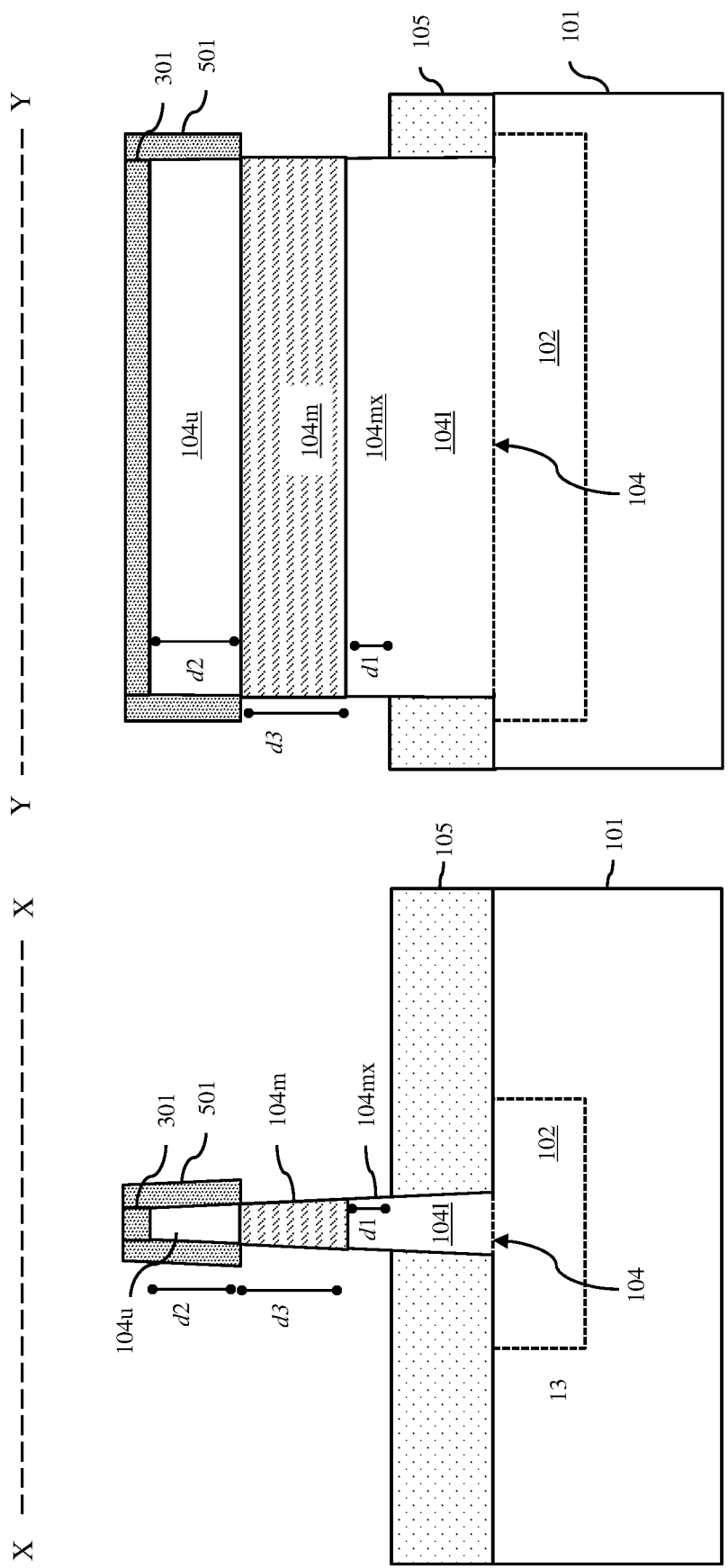
Figures 2, 9B:
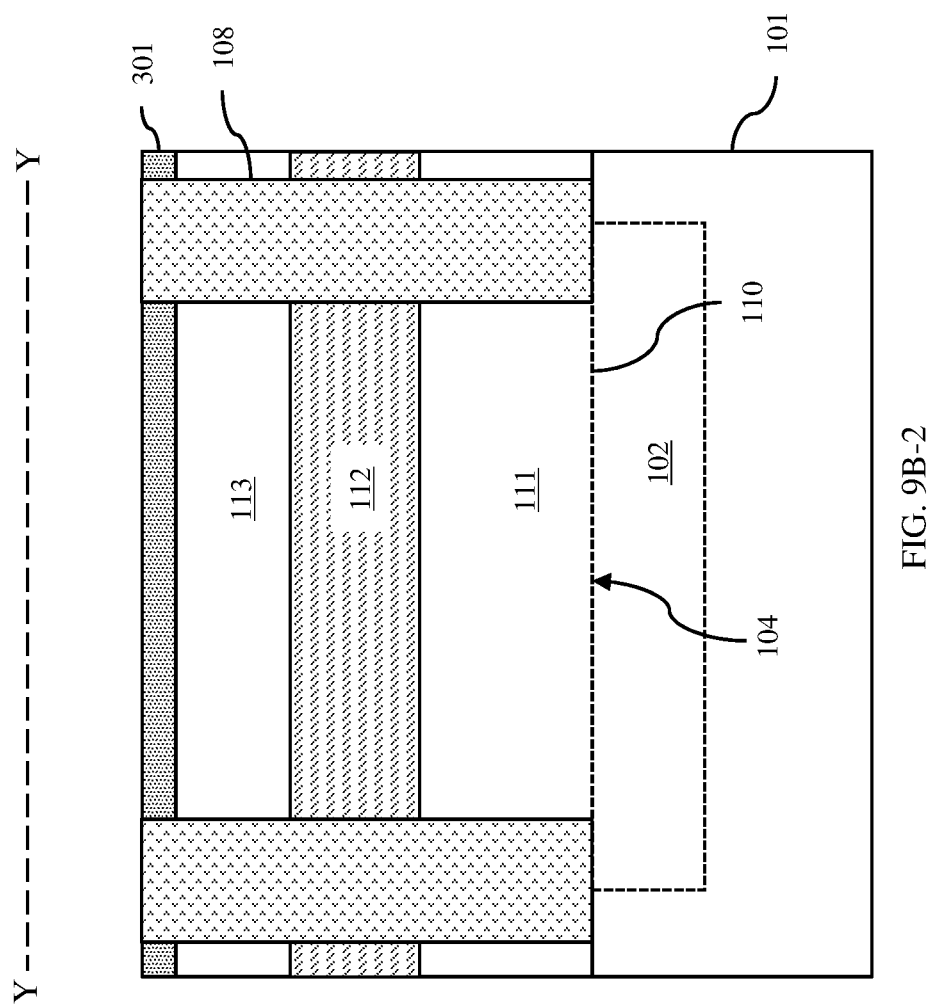

In method embodiments where the lateral BJT 150 being formed is a conventional BJT, the semiconductor fin 104 not be processed so as to change the semiconductor material therein. However, in method embodiments where the lateral BJT 150 being formed is an HBT, then the section of the middle portion 104m of the semiconductor fin 104 exposed at process 214 is processed to convert it from the first semiconductor material to a second semiconductor material that is different from the first semiconductor material (see process 216). For example, the section of the semiconductor fin 104 can be subjected to a germanium condensation process to convert it from the silicon to silicon germanium. In an exemplary germanium condensation process, an epitaxial semiconductor layer 701 (e.g., an epitaxial layer of germanium or silicon germanium) is grown on the exposed section of the semiconductor fin. As illustrated in FIG. 7A, it is specifically grown on the opposing sidewalls of the exposed section of the semiconductor fin 104. In embodiments without fin-cut isolation regions (e.g., as shown in FIG. 7B-1), this epitaxial semiconductor layer 701 is also grown on the opposing ends of exposed section of the semiconductor fin. However, in embodiment with fin-cut isolation regions (e.g., as shown in FIG. 7B-2), the fin-cut isolation regions prevent growth of this material on the opposing ends.

Then, a high-temperature thermal anneal process is performed in an oxidizing environment in order to cause migration of germanium ions from the epitaxial semiconductor layer 701 into the adjacent section of the semiconductor fin 104, thereby converting that section from silicon to silicon germanium. It should be noted that one result of the presence of the oxidizing environment during germanium condensation is formation of an oxide layer 801 on the section of the semiconductor fin 104 where the layer 701 was (see FIG. 8A and FIG. 8B-1 or FIG. 8B-2). A selective isotropic oxide etch process can be performed in order to selectively remove the oxide layer 801 (see FIG. 9A and FIG. 9B-1 or FIG. 9B-2). It should be noted that if the isolation layer 105 is also an oxide layer, then, due to the isotropic nature of this oxide etch process, the isolation layer 105 will also be etched back to some extent, as illustrated. Thus, the exposed middle portion 104m will include an upper section comprising the second semiconductor material and a lower section comprising the first semiconductor material and the upper section (which comprise the second semiconductor material) will be separated from the lower portion 104l of the semiconductor fin 104 and the isolation layer 105 by some distance (d1).

Figures 1, 10B:
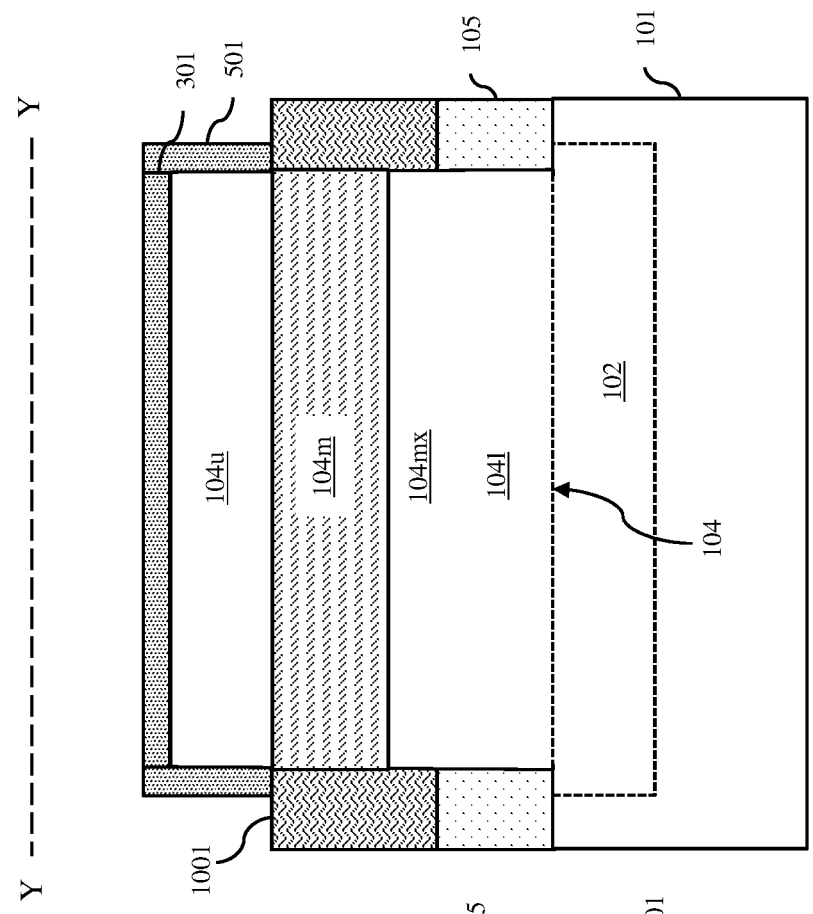
Figure 10A:
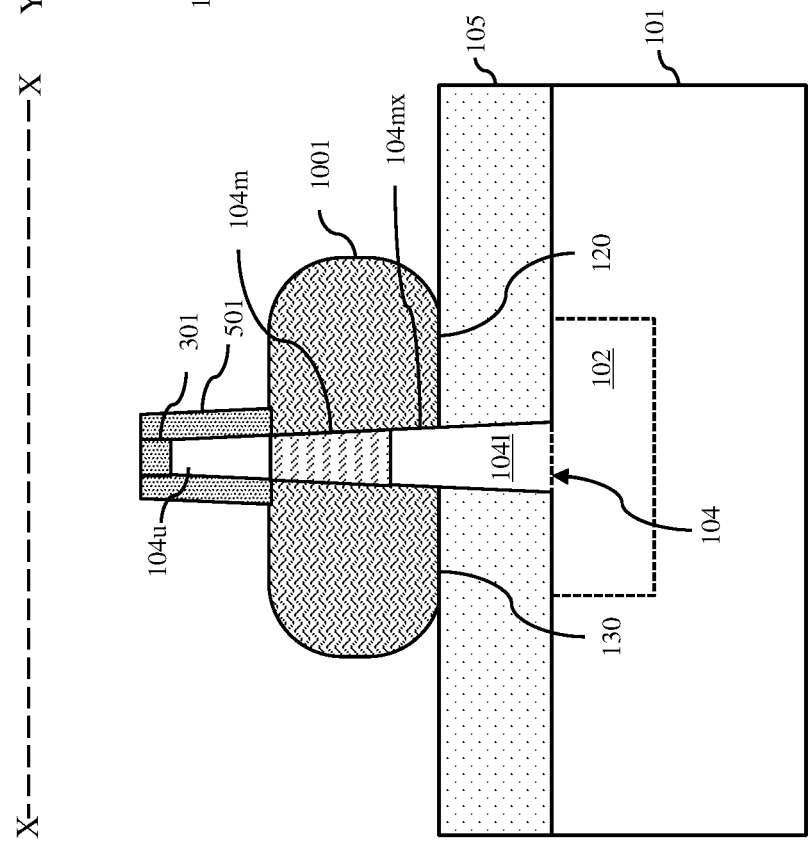
Figures 2, 10B:
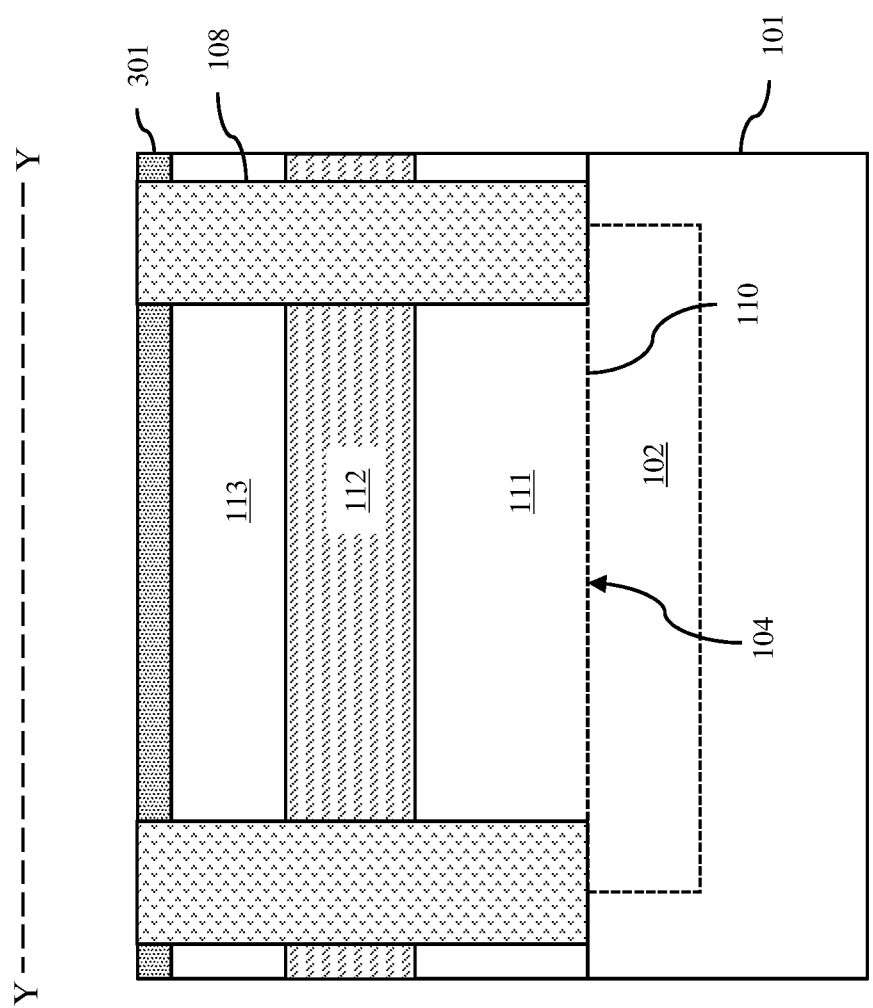
Figure 11:
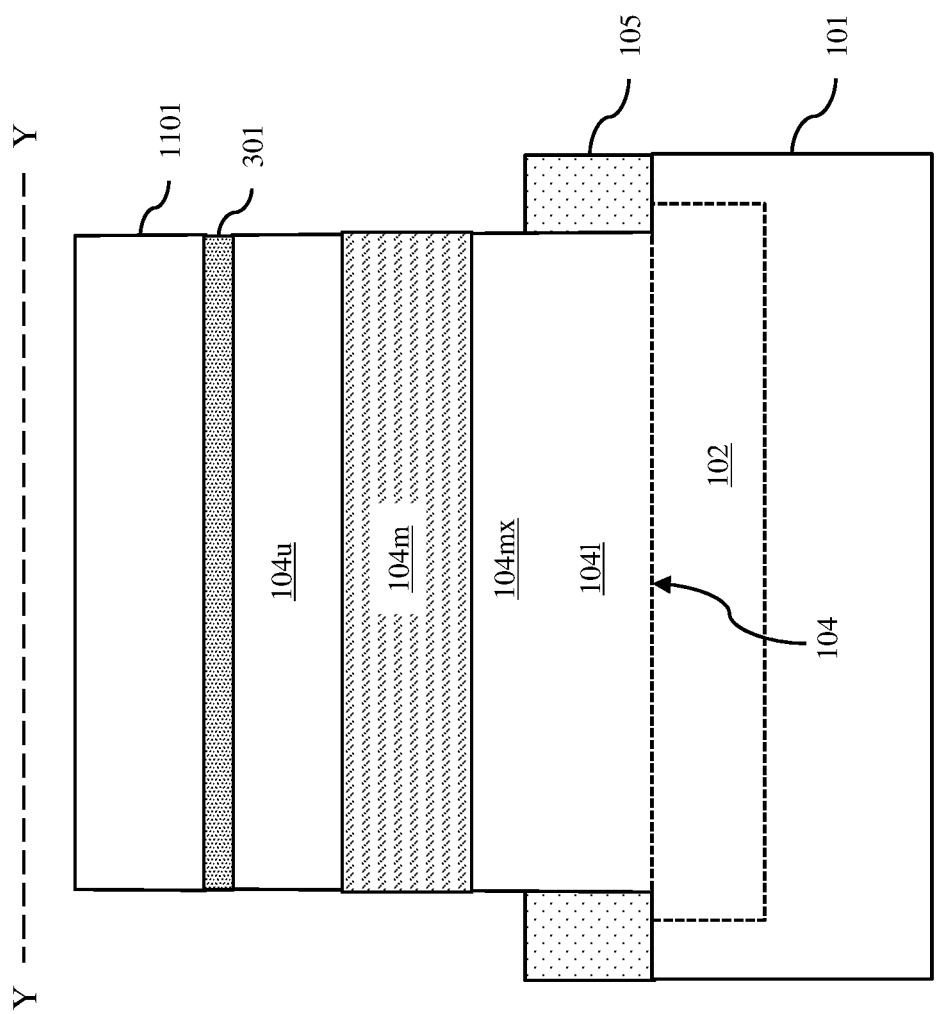
FIG. 11 is a cross-section diagram illustrating a partially completed semiconductor structure formed according to the flow diagram of FIG. 2.

The method embodiments can further include forming a collector 130 and an emitter 120 on the top surface of the isolation layer 105 positioned laterally immediately adjacent to opposing sidewalls, respectively, of the middle portion 104m of the semiconductor fin 104 (see process 218 and FIG. 10A and FIG. 10B-1 or FIG. 10B-2). Specifically, at process 218, epitaxial semiconductor material 1001 can be grown laterally and selectively from exposed sidewalls of the second portion 104m of the semiconductor fin 104 such that they are monocrystalline in structure. Regardless of whether the lateral BJT 150 is a conventional BJT or an HBT, the epitaxial semiconductor material 1001 can be the first semiconductor material (e.g., silicon) and can be in situ doped so as to have the second-type conductivity at a relatively high conductivity level. As mentioned above, for an NPN-type BJT, the second-type conductivity is N-type conductivity. Thus, for an NPN-type BJT, the collector 130 is an N+ collector and so that the emitter 120 is an N+ emitter. For a PNP-type BJT, the second-type conductivity is P-type conductivity so that the collector 130 is a P+ collector and so that the emitter 120 is a P+ emitter. It should be noted that in embodiments where fin-cut isolation regions were not formed, the epitaxial semiconductor material 1001 will also grow on the opposing ends of the middle portion 104m of the semiconductor fin, as illustrated in FIG. 10B-1). In order to prevent shorting of the collector 130 and the emitter 120, the epitaxial semiconductor material 1001 must be removed from the opposing ends of semiconductor fin 104. For example, as illustrated in FIG. 11, a mask 1101 can be formed (e.g., lithographically patterned) above the semiconductor fin 104 and a directional etch process can be performed in order to remove all of the epitaxial semiconductor material 1001 from the opposing ends of the semiconductor fin 104 such that the collector 130 and emitter 120 on the opposing sides of the semiconductor fin are physically disconnected from each other. The mask 1101 can then be selectively removed.

The method embodiments can further include selectively removing the cap layer 301 and sacrificial sidewall spacers 501 from the semiconductor fin 104 (see process 220). For example, if the cap layer 301 and sacrificial sidewall spacers 501 were made from silicon nitride. A conventional nitride strip process (also referred to as a wet etch process) could be performed. For example, the silicon nitride could be etched away using a heated acid bath of phosphoric acid and de-ionized water.

Figures 1, 12A, 12B:
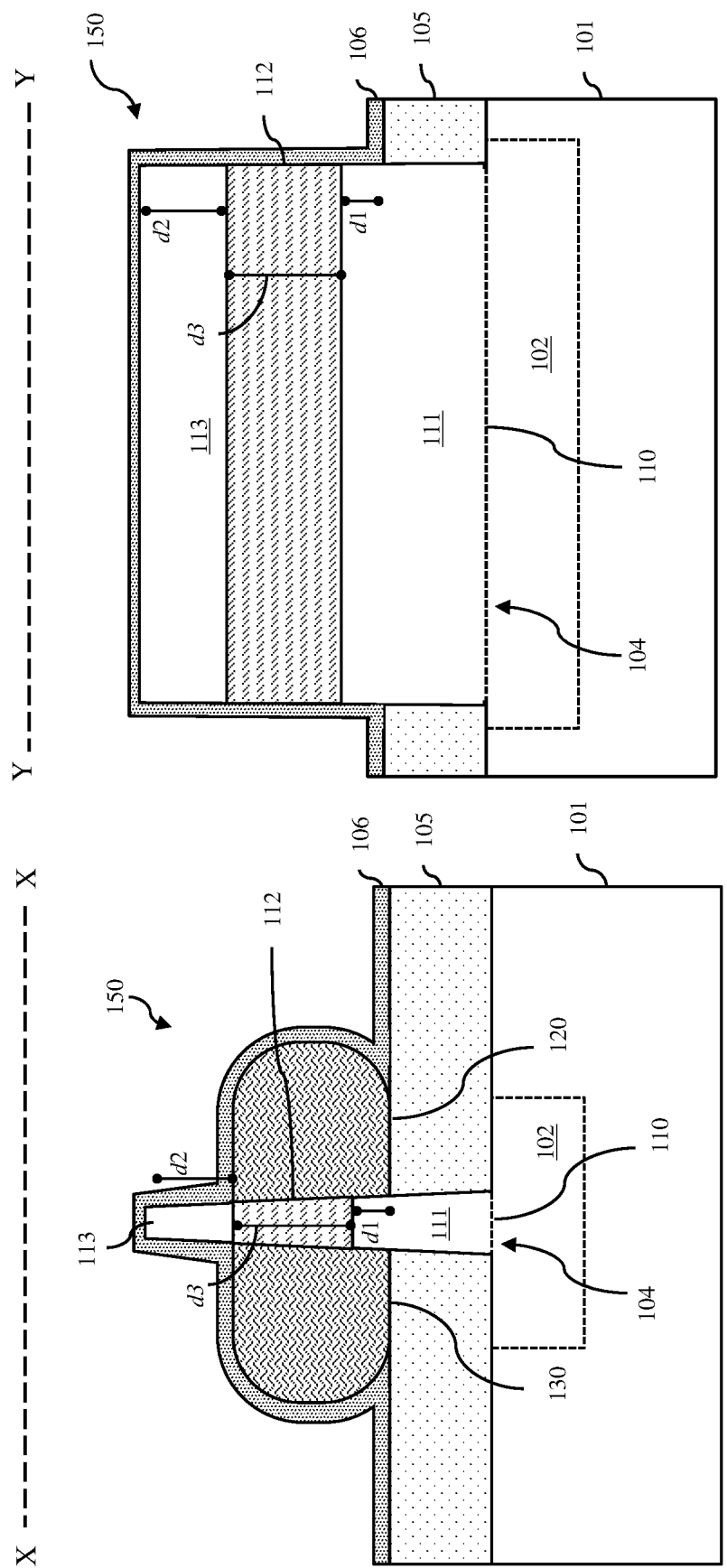
Figures 2, 12B:
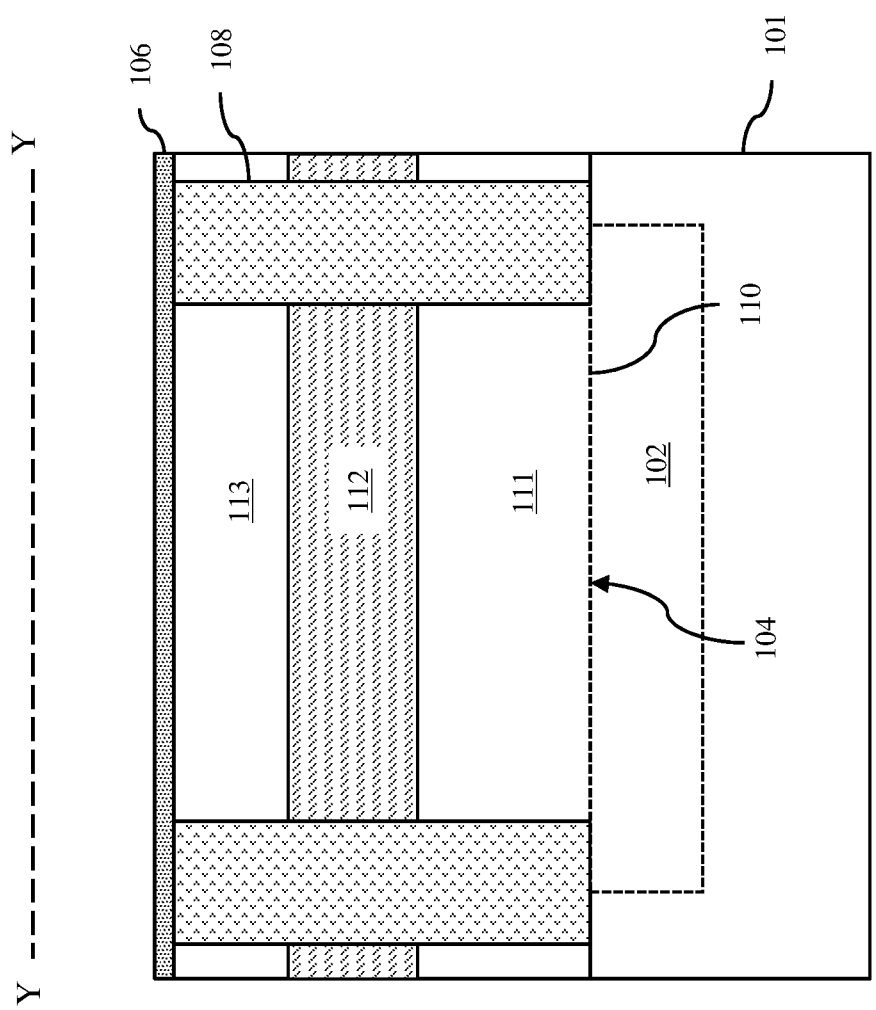
Figures 1, 13B:
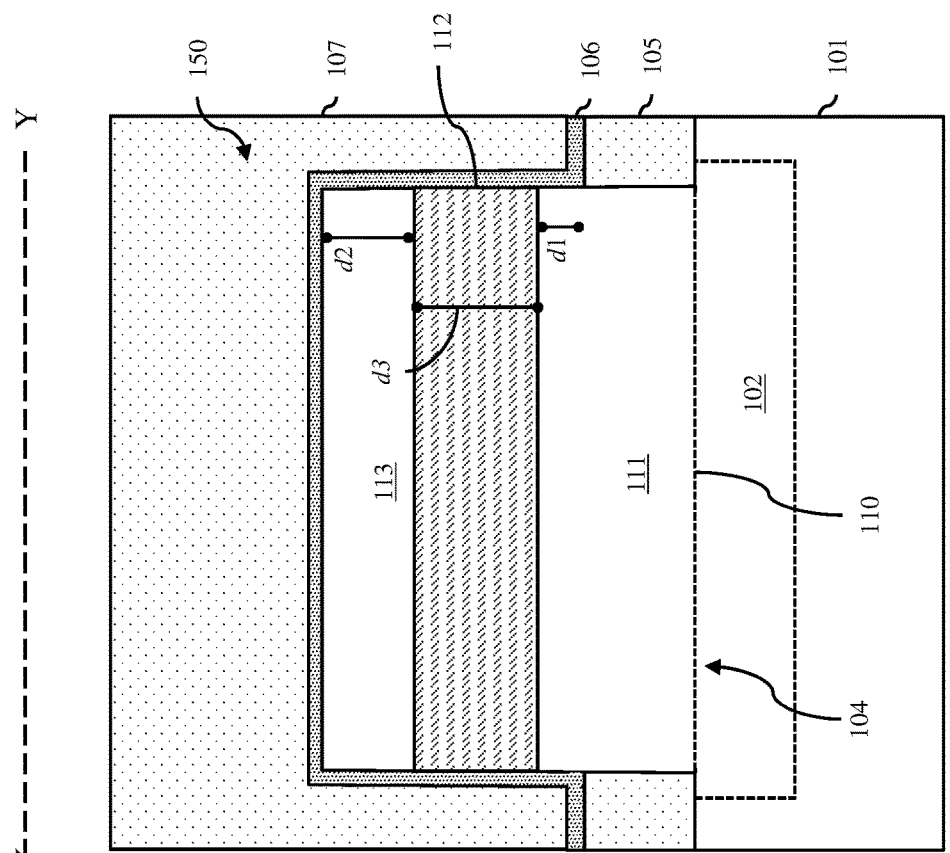
Figure 13A:
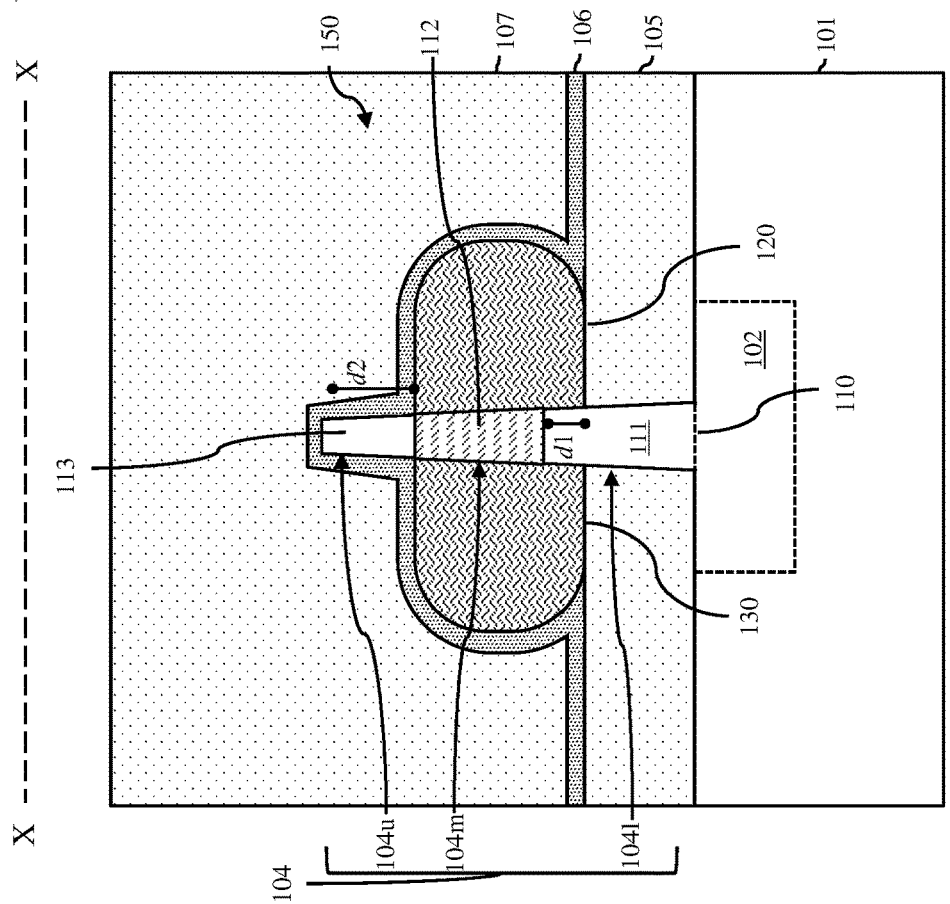
Figures 2, 13B:
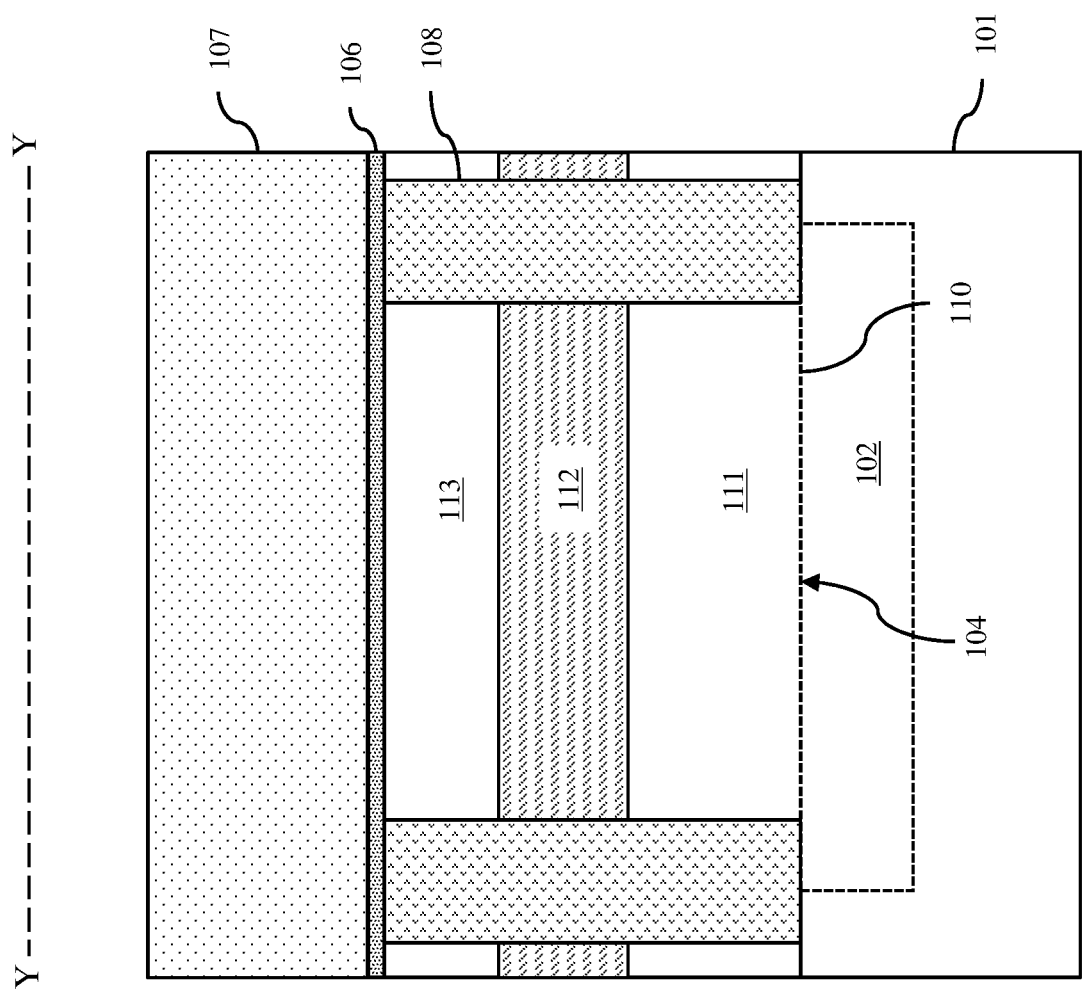

The method embodiments can further include forming multiple dielectric layers over the lateral BJT 150 (see process 222). For example, a first dielectric layer 106 can be conformally deposited over the partially completed structure so as to cover the exposed top surface of the isolation layer 105, the collector 130, the third portion 104u of the semiconductor fin 104 (i.e., the third region 113 of the base 110), and the emitter 120, as illustrated in FIG. 12A. This conformal first dielectric layer 106 can be, for example, a relatively thin, conformal silicon nitride layer. Alternatively, the conformal first dielectric layer 106 can include one or more conformal layers of any suitable dielectric material(s). In embodiments where fin-cut isolation regions were not formed, e.g., as illustrated in FIG. 12B-1, the conformal first dielectric layer 106 can further be immediately adjacent to the opposing ends of the second and third portions 104m-104u and can cover the top surface of the semiconductor fin 104. In embodiments where fin-cut isolation regions 108 were formed, e.g., as illustrated in FIG. 12B-2, the conformal first dielectric layer 106 can cover the top surface of the semiconductor fin 104 but will not be adjacent to the opposing ends of the semiconductor fin (which are covered by the fin-cut isolation regions 108, as discussed above). Additionally, one or more second dielectric layers 107 can be deposited over the conformal first dielectric layer 106 (see FIG. 13A and FIG. 13B-1 or FIG. 13B-2). The second dielectric layer(s) can include, for example, a blanket dielectric layer (e.g., a blanket silicon dioxide layer or a blanket layer of some other suitable dielectric material).

As mentioned above, semiconductor fin(s) formed at process 202 can be formed in a BJT device area and, optionally, also in a finFET device area. Any semiconductor fin(s) formed in a finFET device area were protected (e.g., by a mask layer) during the BJT processing described above. Following such BJT processing, the mask layer over the finFET device area can be removed and another mask layer can be formed over the BJT device area so that finFET processing can be performed without damaging the BJT 150.

The method embodiments can further include forming middle of the line (MOL) contacts 199 including contacts extending through the dielectric layer(s) 107 and 106 to the base 110 (and, particularly, to the extrinsic base region 113), to the collector 130, and to the emitter 120 (see process 224 and FIG. 1A and FIG. 1B-1 or FIG. 1B-2). Techniques for forming MOL contacts are well known in the art and, thus, the details thereof have been omitted from this specification in order to allow the reader to focus on the salient aspects of the disclosed embodiments.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Those skilled in the art will recognize that different dopants can be used to achieve the different conductivity types described above (i.e., N-type conductivity and P-type conductivity) and that the dopants may vary depending upon the different semiconductor materials used. For example, a silicon-based semiconductor material (e.g., silicon, silicon germanium, etc.) having P-type conductivity is typically doped with a P-type dopant (e.g., a Group III dopant, such as boron (B) or indium (In)), whereas a silicon-based semiconductor material having N-type conductivity is typically doped with an N-type dopant (e.g., a Group V dopant, such as arsenic (As), phosphorous (P) or antimony (Sb)). Alternatively, a gallium nitride (GaN)-based semiconductor material having P-type conductivity is typically doped with magnesium (Mg), whereas a gallium nitride (GaN)-based semiconductor material having N-type conductivity is typically doped with silicon (Si). Those skilled in the art will also recognize that different conductivity levels will depend upon the relative concentration levels of the dopants.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration and are not intended to be exhaustive. The present invention is not limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
an isolation layer;
a bipolar junction transistor comprising:
a base comprising a semiconductor fin having a first portion extending through the isolation layer, a second portion on the first portion, and a third portion on the second portion, wherein the isolation layer is positioned laterally immediately adjacent to opposing sidewalls of the first portion; and
a collector and an emitter above the isolation layer and positioned laterally immediately adjacent to opposing sidewalls, respectively, of the second portion; and
a dielectric layer on the collector and the emitter and further positioned laterally immediately adjacent to and covering opposing sidewalls of the third portion.

2. The structure of claim 1, wherein the first portion and the third portion have a first-type conductivity and wherein the collector and the emitter have a second-type conductivity that is different from the first-type conductivity.

3. The structure of claim 2, wherein the third portion has a higher conductivity level than the first portion.

4. The structure of claim 2,
wherein the bipolar junction transistor comprises an NPN-type bipolar junction transistor,
wherein the first-type conductivity comprises P-type conductivity, and
wherein the second-type conductivity comprises N-type conductivity.

5. The structure of claim 4, further comprising a P-type semiconductor substrate, wherein the isolation layer is on the P-type semiconductor substrate, wherein the first portion extends through the isolation layer from the P-type semiconductor substrate, and wherein the first portion and the P-type semiconductor substrate have approximately equal P-type conductivity levels.

6. The structure of claim 5, wherein the P-type semiconductor substrate further comprises an Nwell and wherein the first portion is adjacent to the Nwell.

7. The structure of claim 2,
wherein the bipolar junction transistor comprises a PNP-type bipolar junction transistor,
wherein the first-type conductivity comprises N-type conductivity,
wherein the second-type conductivity comprises P-type conductivity.

8. The structure of claim 1, wherein the isolation layer is positioned laterally immediately adjacent to opposing sidewalls and opposing ends of the first portion and wherein the dielectric layer is positioned laterally immediately adjacent to opposing ends of the second portion and opposing ends of the third portion.

9. A structure comprising:
an isolation layer;
a heterojunction bipolar transistor comprising:

a base comprising a semiconductor fin having a first portion extending through the isolation layer, a second portion on the first portion, and a third portion on the second portion, wherein the isolation layer is positioned laterally immediately adjacent to opposing sidewalls of the first portion, wherein the first portion and the third portion comprise a first semiconductor material, and wherein at least one section of the second portion comprises a second semiconductor material that is different from the first semiconductor material; and a collector and an emitter above the isolation layer and positioned laterally immediately adjacent to opposing sidewalls, respectively, of the second portion; and a dielectric layer on the collector and the emitter and further positioned laterally immediately adjacent to and covering opposing sidewalls of the third portion.

10. The structure of claim 9, wherein the first semiconductor material comprises silicon and wherein the second semiconductor material comprises silicon germanium.

11. The structure of claim 9, wherein the first portion and the third portion have a first-type conductivity, wherein the third portion has a higher conductivity level than the first portion, and wherein the collector and the emitter have a second-type conductivity that is different from the first-type conductivity.

12. The structure of claim 11,
wherein the heterojunction bipolar transistor comprises an NPN-type heterojunction bipolar transistor,
wherein the first-type conductivity comprises P-type conductivity, and
wherein the second-type conductivity comprises N-type conductivity.

13. The structure of claim 12, further comprising a P-type semiconductor substrate, wherein the isolation layer is on the P-type semiconductor substrate, wherein the first portion extends through the isolation layer from the P-type semiconductor substrate, and wherein the first portion and the P-type semiconductor substrate have approximately equal P-type conductivity levels.

14. The structure of claim 13, wherein the P-type semiconductor substrate further comprises an Nwell and wherein the first portion is adjacent to the Nwell.

15. The structure of claim 11,
wherein the heterojunction bipolar transistor comprises a PNP-type heterojunction bipolar transistor,
wherein the first-type conductivity comprises N-type conductivity,
wherein the second-type conductivity comprises P-type conductivity.

16. The structure of claim 9, wherein the isolation layer is positioned laterally immediately adjacent to opposing sidewalls and opposing ends of the first portion and wherein the dielectric layer is positioned laterally immediately adjacent to opposing ends of the second portion and opposing ends of the third portion.

* * * * *